(12) United States Patent
Doh et al.

(10) Patent No.: US 12,207,548 B2
(45) Date of Patent: Jan. 21, 2025

(54) LIGHT-EMITTING DEVICE AND APPARATUS INCLUDING THE SAME

(71) Applicant: Samsung Display Co., Ltd., Yongin-si (KR)

(72) Inventors: Hyunmi Doh, Yongin-si (KR); Changhee Lee, Yongin-si (KR); Myoungjin Park, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 981 days.

(21) Appl. No.: 17/030,031

(22) Filed: Sep. 23, 2020

(65) Prior Publication Data

US 2021/0217965 A1    Jul. 15, 2021

(30) Foreign Application Priority Data

Jan. 9, 2020  (KR) .................... 10-2020-0003182

(51) Int. Cl.
*B82Y 40/00* (2011.01)
*C01G 9/02* (2006.01)
(Continued)

(52) U.S. Cl.
CPC ............ *H10K 85/656* (2023.02); *C01G 9/02* (2013.01); *C09K 11/885* (2013.01); *B82Y 40/00* (2013.01); *H10K 50/16* (2023.02)

(58) Field of Classification Search
CPC .............................................. H10K 59/80524
See application file for complete search history.

(56) References Cited

U.S. PATENT DOCUMENTS 9,419,174 B2    8/2016  Zheng et al.
2007/0207341 A1* 9/2007 Iida .................. H10K 85/633
                                                    252/301.16

(Continued)

FOREIGN PATENT DOCUMENTS

EP          3486964 A1 *  5/2019  ........... C09K 11/703
KR   10-2006-0101184 A    9/2006
(Continued)

OTHER PUBLICATIONS

Schmitz et al., Chem. Mater. 2000, 12, 3012-3019.*

(Continued)

*Primary Examiner* — Vu A Nguyen
(74) *Attorney, Agent, or Firm* — Lewis Roca Rothgerber Christie LLP

(57) ABSTRACT

A light-emitting device includes a first electrode, an emission layer, an electron transport layer, a metal-nucleation inducing layer, and a second electrode. The metal-nucleation inducing layer is in direct contact with the second electrode, and includes a metal-nucleation inducing material having at least one metal-nucleation inducing group. The second electrode includes a metal-containing film that is hybridized with the metal-nucleation inducing material. The metal-nucleation inducing group is a π electron-deficient nitrogen-containing $C_1$-$C_{60}$ cyclic group that is unsubstituted or substituted with at least one $R_1$ or a group represented by one of Formulae 1A to 1E, and does not comprise a group represented by *—C(=O)(OH) and a cyano group. The emission efficiency and/or lifespan of the light-emitting device may be improved because of the metal-nucleation inducing layer.

17 Claims, 1 Drawing Sheet

(51) Int. Cl.
　　　*C09K 11/88*　　(2006.01)
　　　*H10K 50/16*　　(2023.01)
　　　*H10K 85/60*　　(2023.01)

(56)　　　　　References Cited

U.S. PATENT DOCUMENTS

| | | |
|---|---|---|
| 2009/0039764 A1 | 2/2009 | Cho et al. |
| 2019/0157596 A1 | 5/2019 | Kim et al. |
| 2019/0189932 A1* | 6/2019 | Sekine ................. H10K 50/828 |
| 2019/0280231 A1 | 9/2019 | Kim et al. |

FOREIGN PATENT DOCUMENTS

| | | |
|---|---|---|
| KR | 10-2013-0074815 A | 7/2013 |
| KR | 10-2019-00557733 A | 5/2019 |
| KR | 10-2019-0106824 A | 9/2019 |
| WO | WO 2016/027938 A1 | 2/2016 |

OTHER PUBLICATIONS

Kang, Hongkyu et al., "Polymer-metal hybrid transparent electrodes for flexible electronics", *Nature Communications*, 2015, 6, 6503, p. 1-7.

Jeong, Soyeong et al., "Role of Polymeric Metal Nucleation Inducers in Fabricating Large-Area, Flexible, and Transparent Electrodes for Printable Electronics", *Adv. Funct. Mater.*, 2017, 27, 1606842, p. 1-8.

Song, Changjian et al., "Sulfonate anionic small molecule as a cathode interfacial material for highly efficient polymer solar cells", *RSC Adv.*, 2016, 6, pp. 33523-33528.

* cited by examiner

10

| |
|---|
| 190 |
| 157 |
| 155 |
| 153 |
| 110 |

LIGHT-EMITTING DEVICE AND APPARATUS INCLUDING THE SAME

CROSS-REFERENCE TO RELATED APPLICATION

This application claims priority to and the benefit of Korean Patent Application No. 10-2020-0003182, filed on Jan. 9, 2020, in the Korean Intellectual Property Office, the entire content of which is incorporated herein by reference.

BACKGROUND

1. Field

One or more aspects of embodiments of the present disclosure relate to a light-emitting device and an apparatus including the same.

2. Description of Related Art

Light-emitting devices convert electrical into light energy. Example light-emitting devices include organic light-emitting devices in which a light-emitting material is an organic material, and quantum dot light-emitting devices in which the light-emitting material is a quantum dot.

A light-emitting device may have a structure in which a first electrode, a hole transport region, an emission layer, an electron transport region, and a second electrode are sequentially formed. Holes provided from the first electrode may move toward the emission layer through the hole transport region, and electrons provided from the second electrode may move toward the emission layer through the electron transport region. The holes and the electrons may recombine in the emission layer to produce excitons. These excitons may transition from an excited state to the ground state to thereby generate light.

SUMMARY

One or more aspects of embodiments of the present disclosure are directed toward a light-emitting device having excellent emission efficiency and/or lifespan properties, and an apparatus including the same.

Additional aspects will be set forth in part in the following description s and, in part, will be apparent from the description, or may be learned by practice of the presented embodiments of the disclosure.

One or more example embodiments of the present disclosure provide a light-emitting device including:
a first electrode,
a second electrode facing the first electrode, and
an emission layer between the first electrode and the second electrode,
wherein an electron transport layer is located between the emission layer and the second electrode,
the electron transport layer substantially does not include (e.g., may substantially exclude or is not formed of) carbon,
a metal-nucleation inducing layer is located between the electron transport layer and the second electrode,
the metal-nucleation inducing layer includes a metal-nucleation inducing material,
the metal-nucleation inducing material includes at least one metal-nucleation inducing group,
the metal-nucleation inducing group may be a π electron-deficient nitrogen-containing $C_1$-$C_{60}$ cyclic group that is unsubstituted or substituted with at least one of $R_1$ or a group represented by one of Formulae 1A to 1E, and does not include a group represented by *—C(=O)(OH) and a cyano group,
the metal-nucleation inducing layer may be in direct contact with the second electrode, and
the second electrode may include a metal-containing film that is hybridized with the metal-nucleation inducing material.

| | |
|---|---|
| *O($Q_1$) | Formula 1A |
| *S($Q_1$) | Formula 1B |
| *—N($Q_1$)($Q_2$) | Formula 1C |
| *—P($Q_1$)($Q_2$) | Formula 1D |
| *—P(=O)($Q_1$)($Q_2$). | Formula 1E |

$R_1$, $Q_1$, and $Q_2$ may each independently be hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and

* indicates a binding site to a neighboring atom.

One or more example embodiments of the present disclosure provide an apparatus including the organic light-emitting device.

BRIEF DESCRIPTION OF THE DRAWING

The above and other aspects, features, and advantages of certain embodiments of the disclosure will be more apparent from the following description taken in conjunction with:
the drawing, which is a schematic view of a light-emitting device according to an embodiment.

DETAILED DESCRIPTION

Reference will now be made in more detail to embodiments, examples of which are illustrated in the accompanying drawings, wherein like reference numerals refer to like elements throughout and redundant description thereof will be omitted. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

For example, expressions such as "at least one of," "one of," and "selected from," when preceding a list of elements, modify the entire list of elements and do not modify the individual elements of the list.

As the present disclosure can apply various transformations and can have various examples, specific examples will be illustrated in the drawings and described in detail in the detailed description. Effects and features of the present disclosure, and methods of achieving the same will be clarified by referring to the Examples described herein with reference to the drawings. However, the present disclosure is not limited to the examples disclosed below, and may be implemented in various forms.

As used herein, the singular forms "a," "an," and "the" are intended to include the plural forms as well, unless the context clearly indicates otherwise. Further, the use of "may" when describing embodiments of the present disclosure refers to "one or more embodiments of the present disclosure".

It will be further understood that the terms "includes," "including," "comprises," and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. For example, because the sizes and thicknesses of components in the drawings are arbitrarily illustrated for convenience of explanation, the following embodiments of the present disclosure are not limited thereto.

In the present specification, the term "room temperature" refers to about 25° C.

Hereinafter, an example of the light-emitting device will be described with reference to the drawing.

The light-emitting device 10 illustrated in the drawing includes a first electrode 110, an emission layer 153, an electron transport layer 155, a metal-nucleation inducing layer 157, and a second electrode 190.

[First Electrode 110]

In the drawing, a substrate may be additionally disposed under the first electrode 110 and/or above the second electrode 190. The substrate may be a glass substrate and/or a plastic substrate.

The first electrode 110 may be formed by depositing or sputtering a material for forming the first electrode 110 on the substrate. When the first electrode 110 is an anode, a high work function material that can easily inject holes may be used as a material for the first electrode 110.

The first electrode 110 may be a reflective electrode, a semi-transmissive electrode, or a transparent electrode. When the first electrode 110 is a transparent electrode, a material for forming a first electrode may include indium tin oxide (ITO), indium zinc oxide (IZO), tin oxide ($SnO_2$), zinc oxide (ZnO), or any combination thereof. In one or more embodiments, when the first electrode 110 is a semi-transparent electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including (e.g., consisting of) a single layer, or a multi-layered structure including a plurality of layers. For example, the first electrode 110 may have a three-layered structure of ITO/Ag/ITO.

[Hole Transport Region]

In some embodiments, a hole transport region may be additionally located between the first electrode 110 and the emission layer 153.

The hole transport region may have: i) a single-layered structure with a single layer including a single material, ii) a single-layered structure with a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure with a single layer including a plurality of different materials, or a multi-layered structure with a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the constituting layers of each structure are sequentially stacked from the first electrode 110 in each stated order.

The hole transport region may include m-MTDATA, TDATA, 2-TNATA, NPB (NPD), β-NPB, TPD, Spiro-TPD, spiro-NPB, methylated-NPB, TAPC, HMTPD, 4,4',4"-tris (N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT:PSS), polyaniline/camphor sulfonic acid (PANI/CSA), polyaniline/poly(4-styrene sulfonate) (PANI/PSS), poly(9,9-dioctyl-fluorene-co-N-(4-butylphenyl)-diphenylamine (TFB), a compound represented by Formula 201, a compound represented by Formula 202, or any combination thereof:

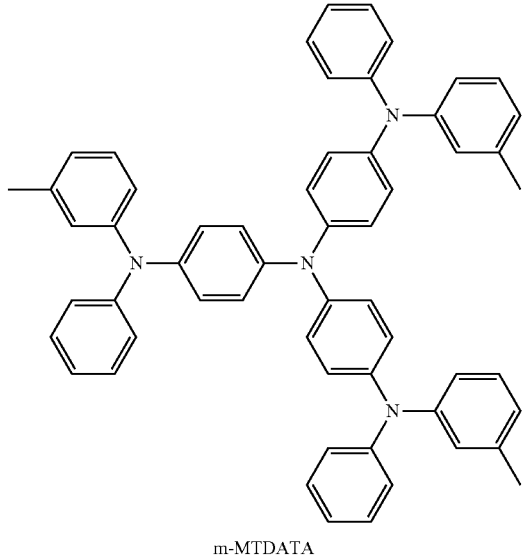

m-MTDATA

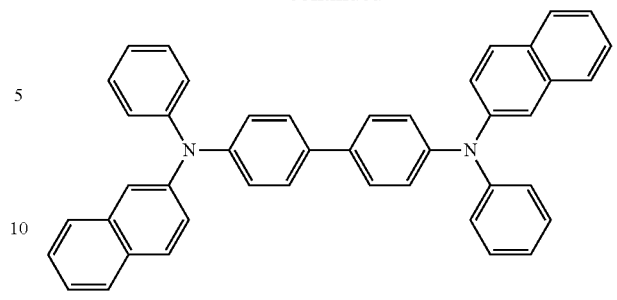
β-NPB
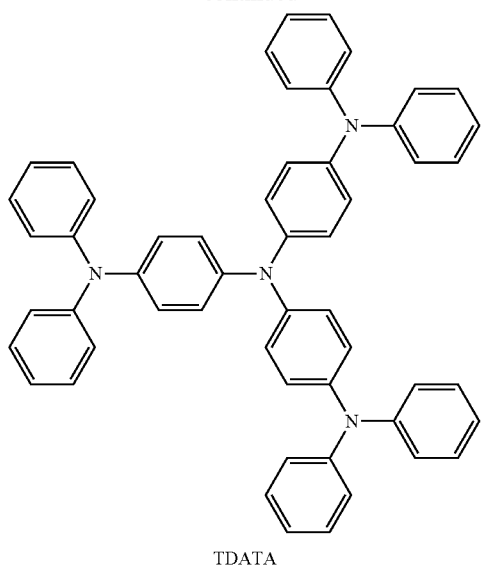
TDATA
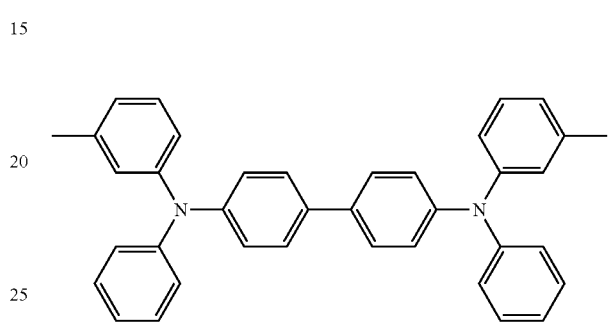
TPD
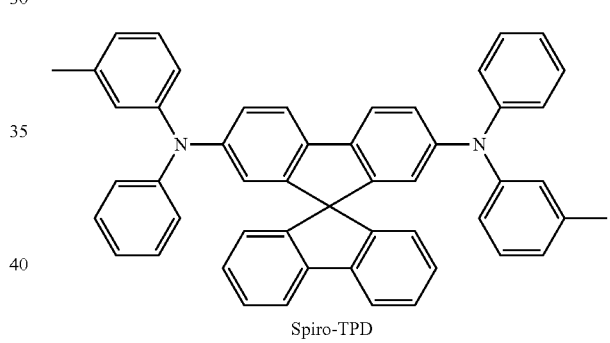
Spiro-TPD
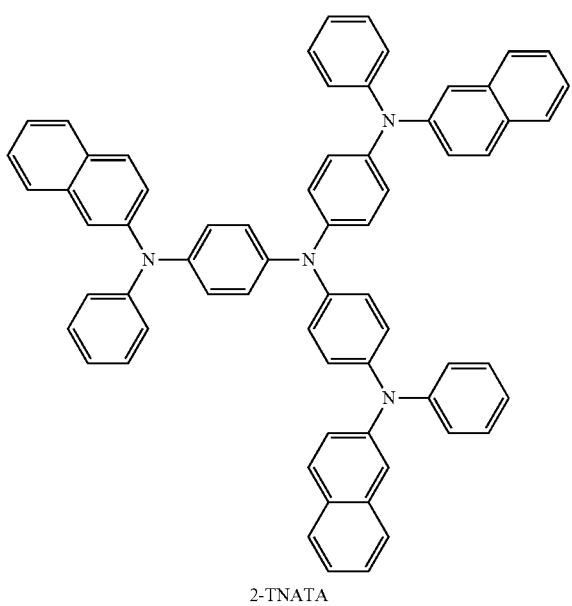
2-TNATA
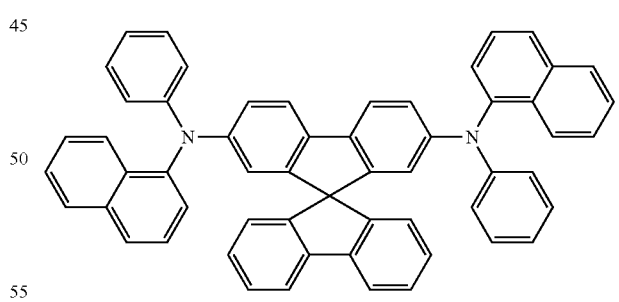
Spiro-NPB
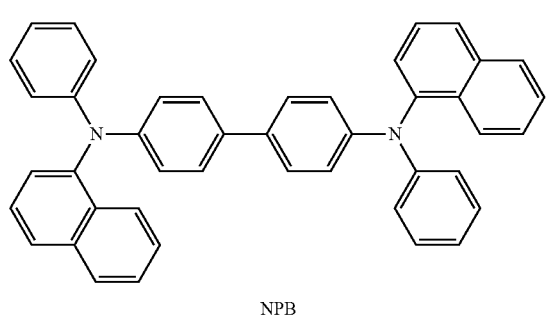
NPB
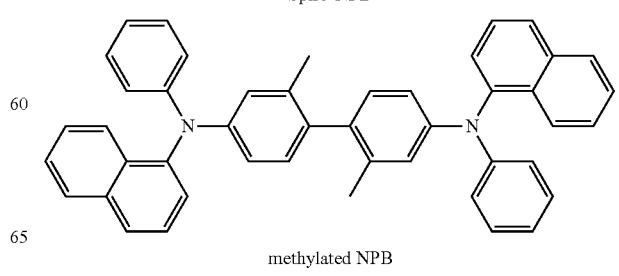
methylated NPB

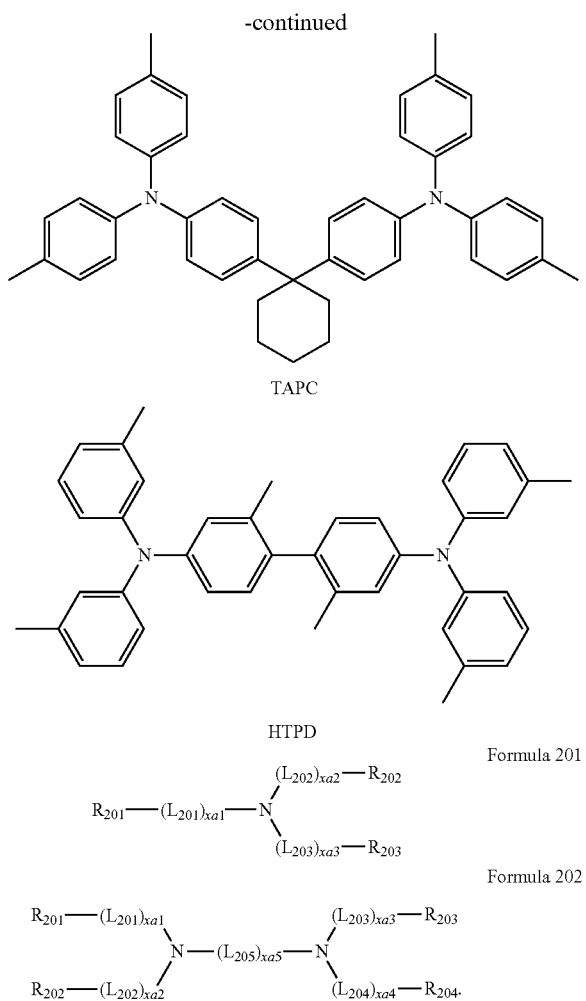

TAPC

HTPD

Formula 201
$$R_{201}\!\!-\!\!(L_{201})_{xa1}\!\!-\!\!N\!\!<\!\!\genfrac{}{}{0pt}{}{(L_{202})_{xa2}\!\!-\!\!R_{202}}{(L_{203})_{xa3}\!\!-\!\!R_{203}}$$

Formula 202
$$R_{201}\!\!-\!\!(L_{201})_{xa1}\!\!\!\!\diagdown\!\!\!\!\!\!\phantom{N}\!\!\!\!\!\!\!\!(L_{203})_{xa3}\!\!-\!\!R_{203}$$
$$\phantom{R_{201}-(L_{201})_{xa1}}N\!\!-\!\!(L_{205})_{xa5}\!\!-\!\!N$$
$$R_{202}\!\!-\!\!(L_{202})_{xa2}\!\!\diagup\!\!\phantom{NNNNNNN}(L_{204})_{xa4}\!\!-\!\!R_{204}.$$

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)—', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may be a carbazolyl group that is unsubstituted, or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, a dibenzothiophenyl group, or any combination thereof.

The compound represented by Formula 201 may be represented by Formula 201-1:

Formula 201-1

For example, the compound represented by Formula 201 may be represented by Formula 201-2:

Formula 201-2

In one embodiment, the compound represented by Formula 201 may be represented by Formula 201-2(1):

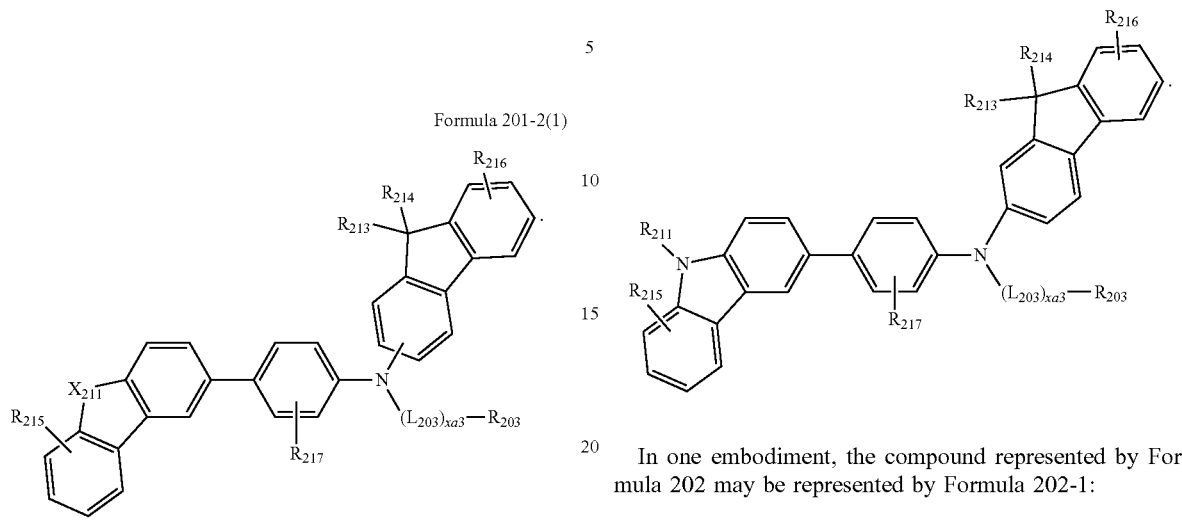

Formula 201-2(1)

In one or more embodiments, the compound represented by Formula 201 may be represented by Formula 201A:

Formula 201A

For example, the compound represented by Formula 201 may be represented by Formula 201A(1):

Formula 201A(1)

In one embodiment, the compound represented by Formula 201 may be represented by Formula 201A-1:

Formula 201A-1

In one embodiment, the compound represented by Formula 202 may be represented by Formula 202-1:

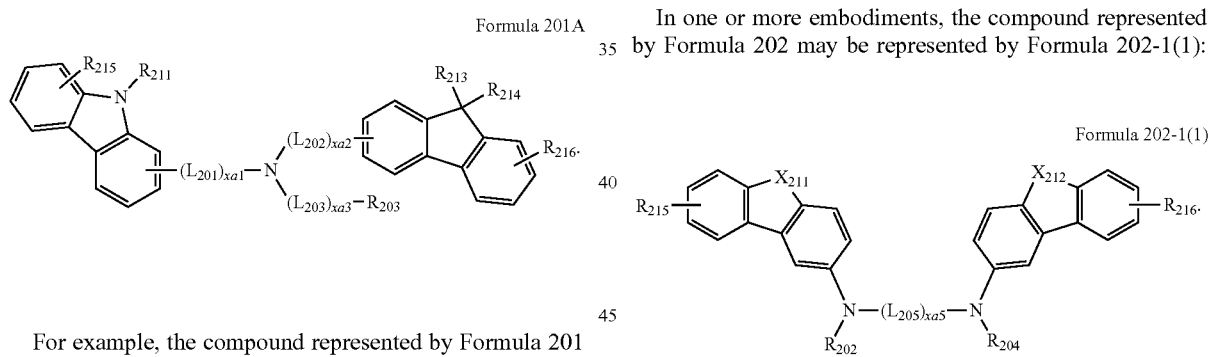

Formula 202-1

In one or more embodiments, the compound represented by Formula 202 may be represented by Formula 202-1(1):

Formula 202-1(1)

In one or more embodiments, the compound represented by Formula 202 may be represented by Formula 202A:

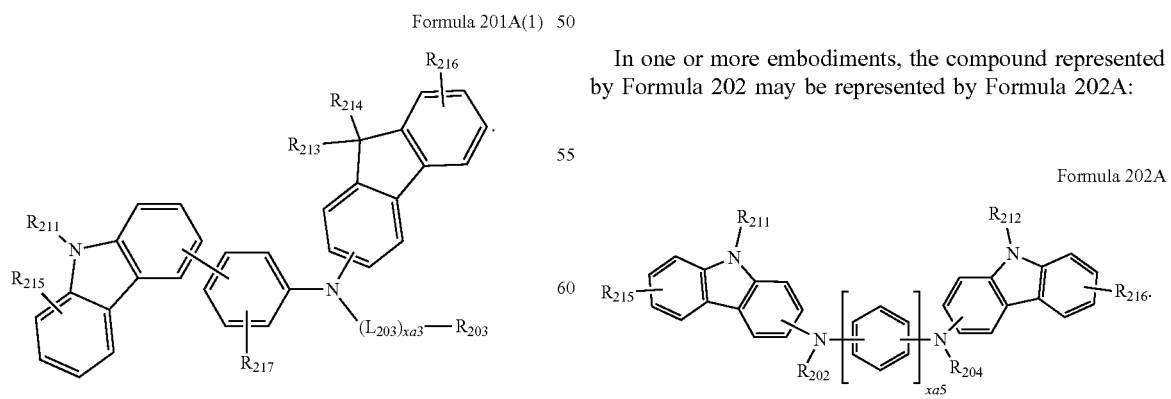

Formula 202A

In one or more embodiments, the compound represented by Formula 202 may be represented by Formula 202A-1:

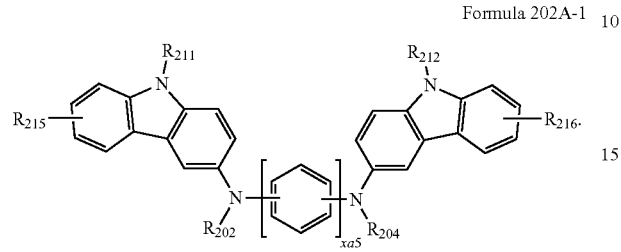

Formula 202A-1

In Formulae 201-1, 201-2, 201-2(1), 201A, 201A(1), 201A-1, 202-1, 202 1(1), 202A, and 202A-1, $L_{201}$ to $L_{203}$, xa1 to xa3, xa5, and $R_{202}$ to $R_{204}$ may each independently be the same as described above, $L_{205}$ may be selected from a phenylene group and a fluorenylene group, $X_{211}$ may be selected from O, S, and $N(R_{211})$, $X_{212}$ may be selected from O, S, and $N(R_{212})$, $R_{211}$ and $R_{212}$ may each independently be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

For example, the hole transport region may include at least one compound selected from Compounds HT1 to HT48:

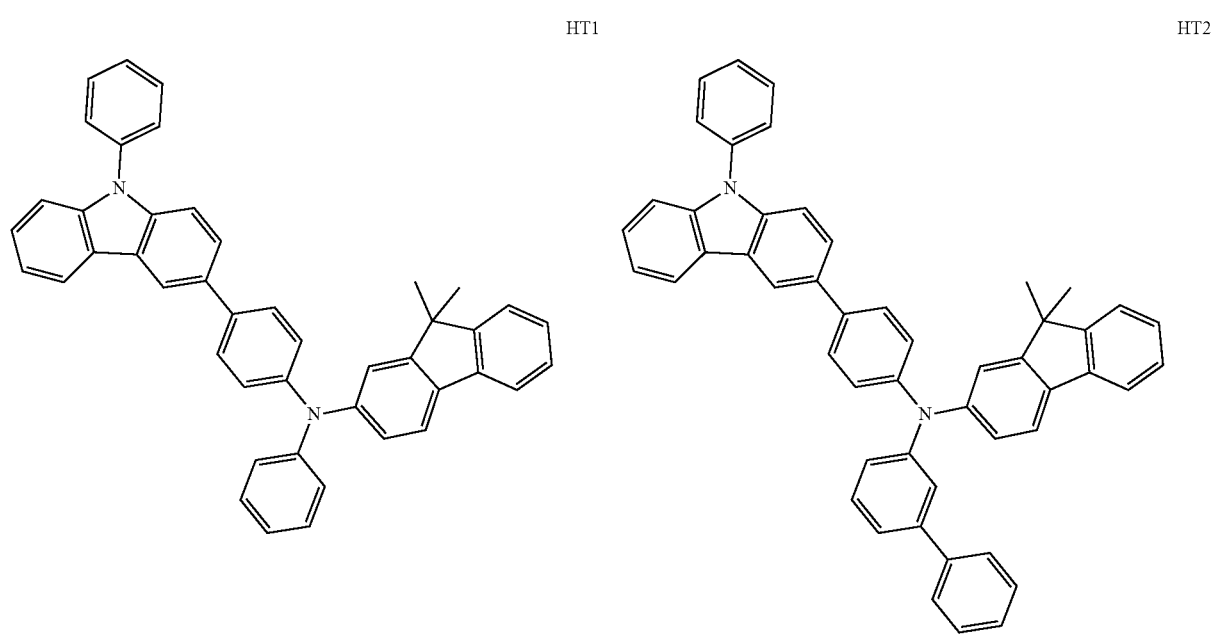

HT3
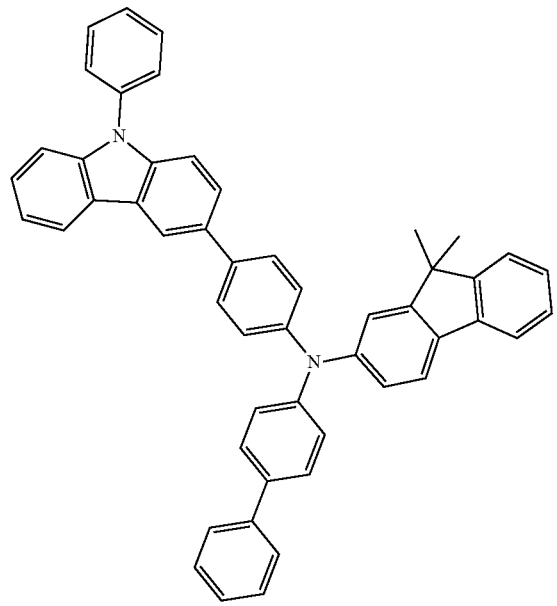
HT4
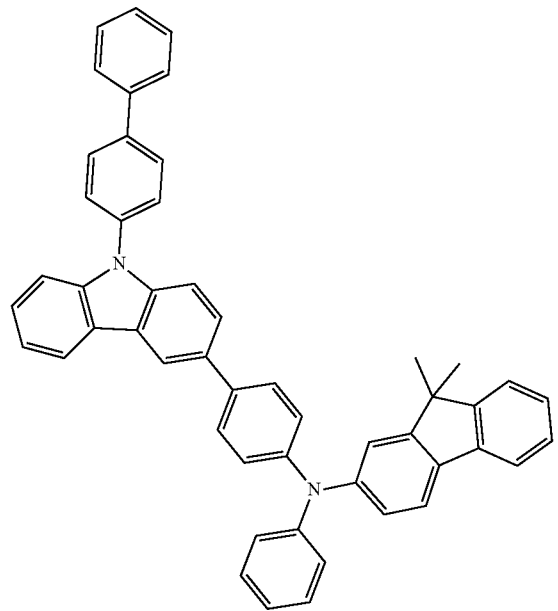
HT5
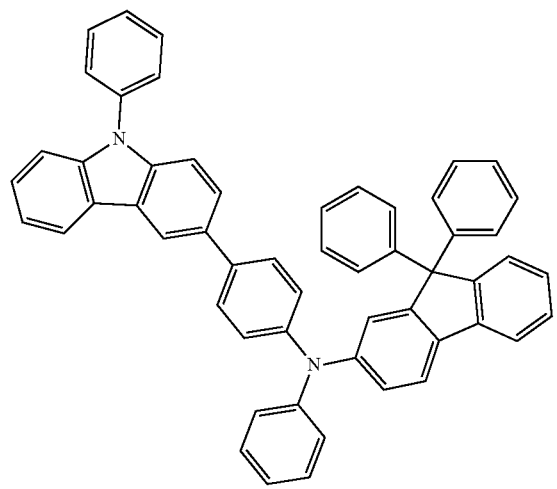
HT6
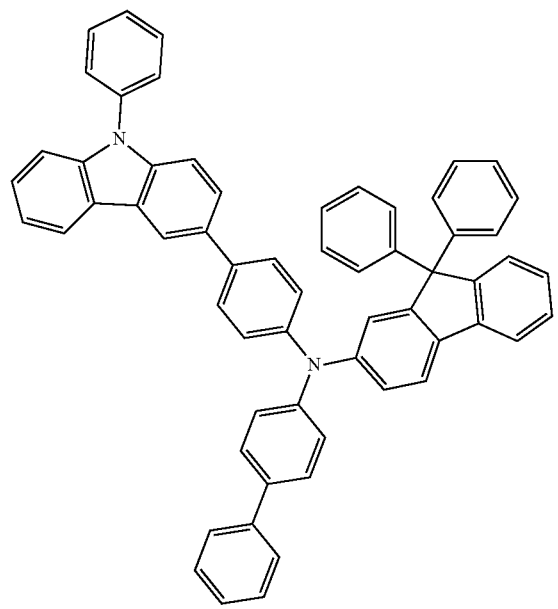

-continued
HT7
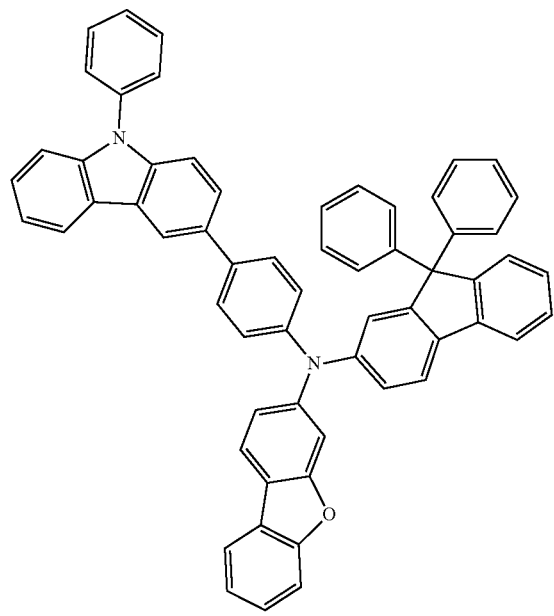
HT8
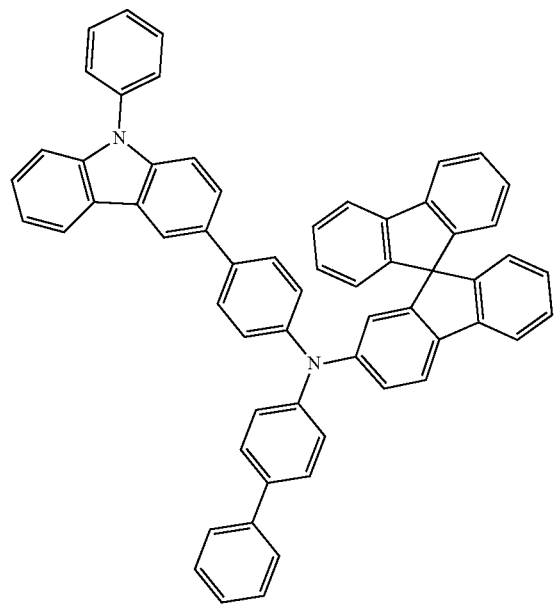
HT9
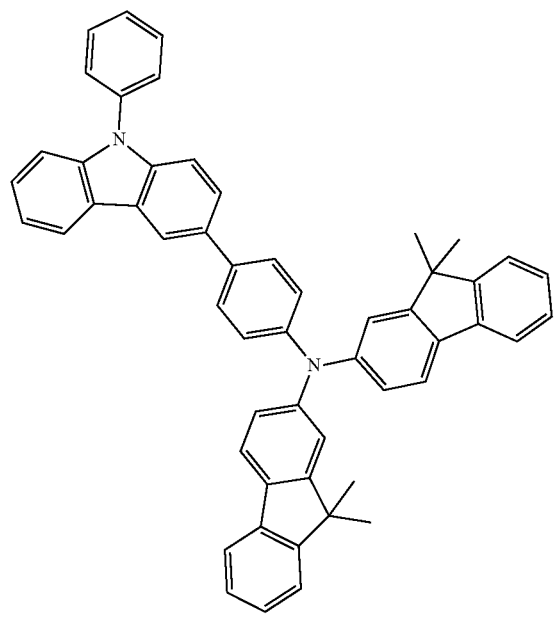
HT10
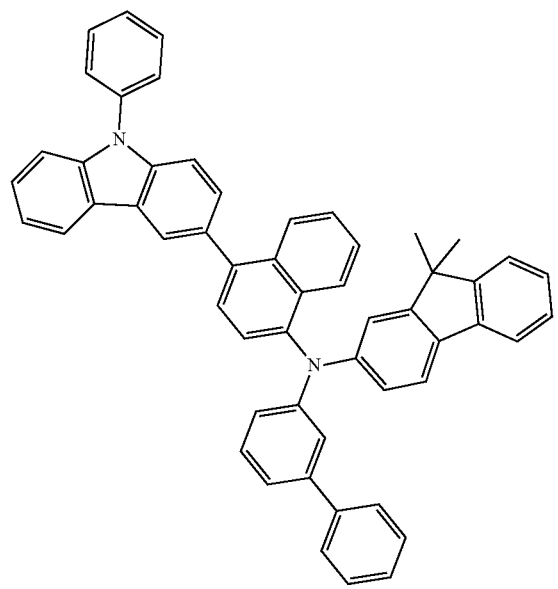

-continued
HT11
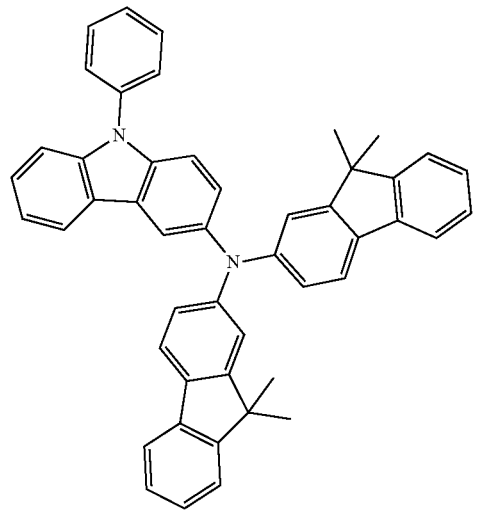
HT12
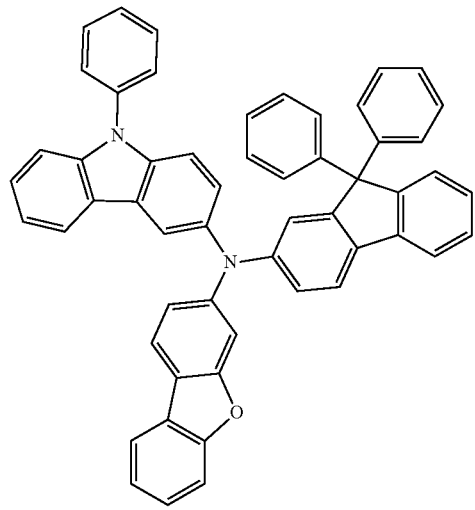
HT13
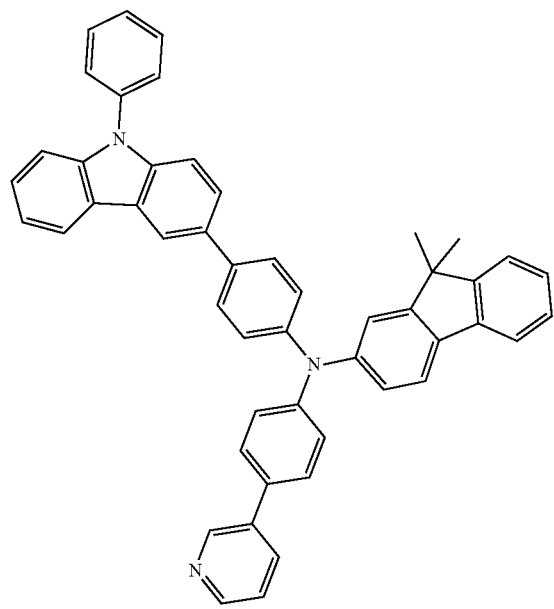
HT14
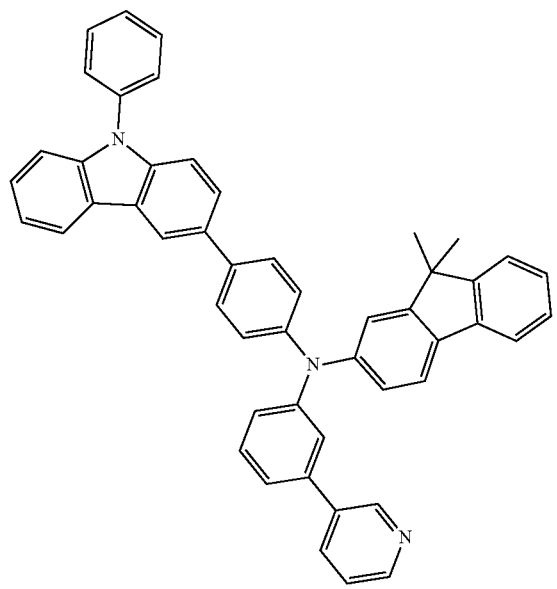
HT15
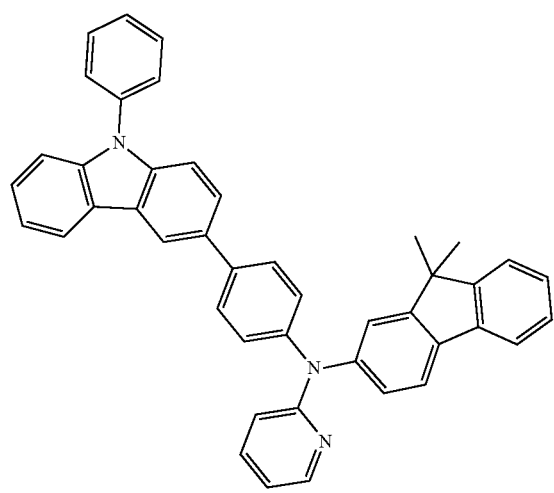
HT16
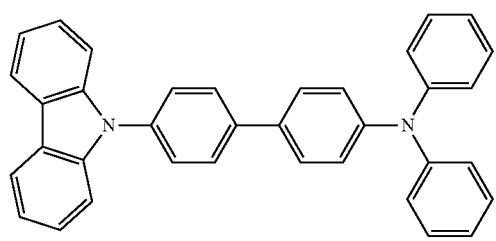

-continued
HT17
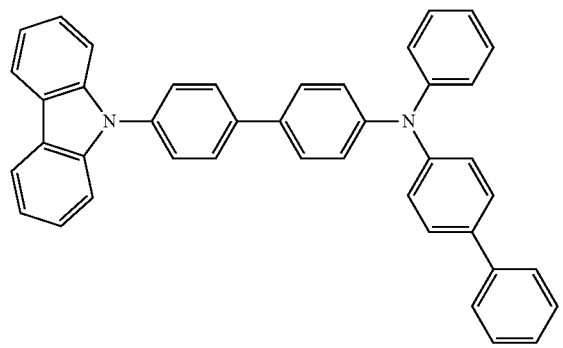
HT18
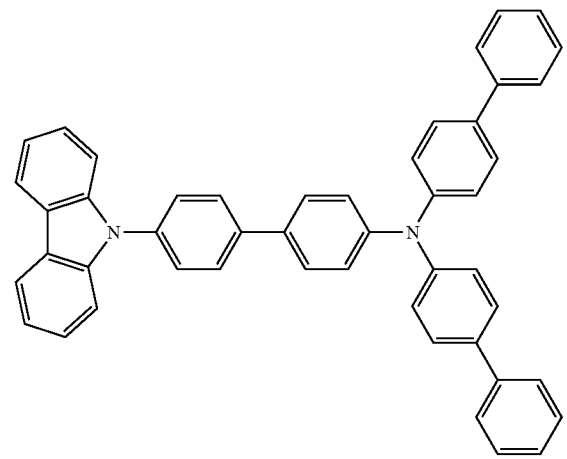
HT19
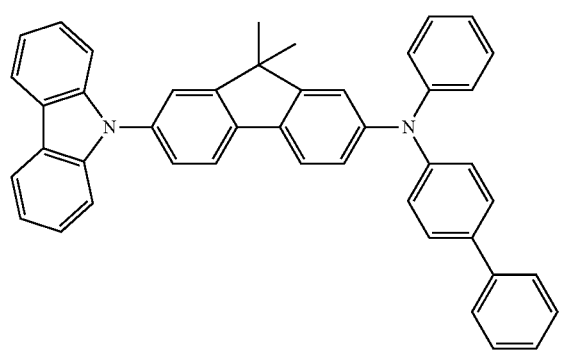
HT20
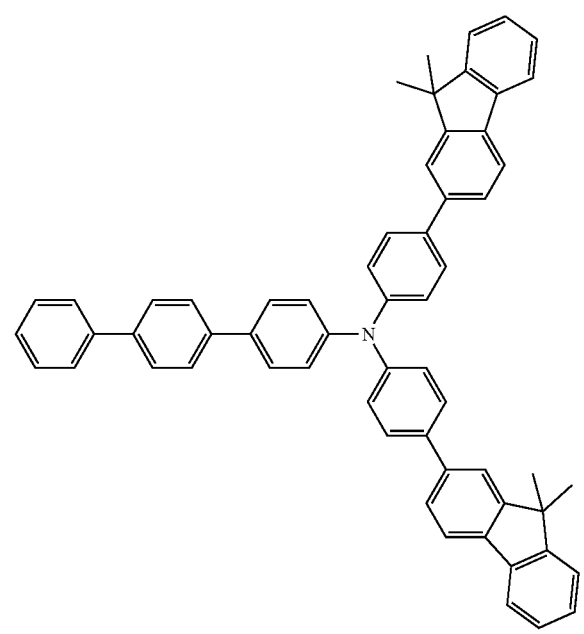

-continued
HT21
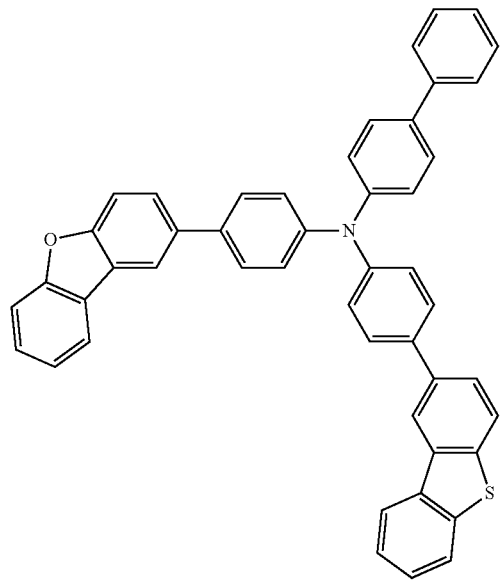
HT22
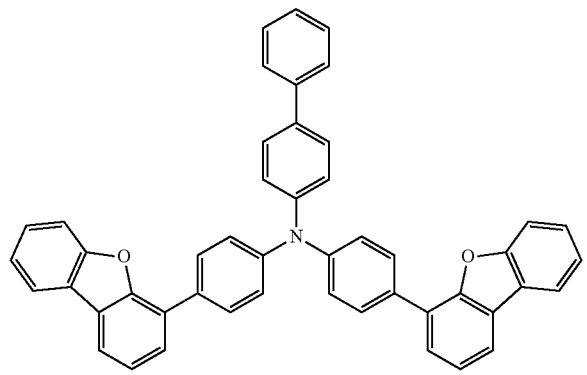
HT23
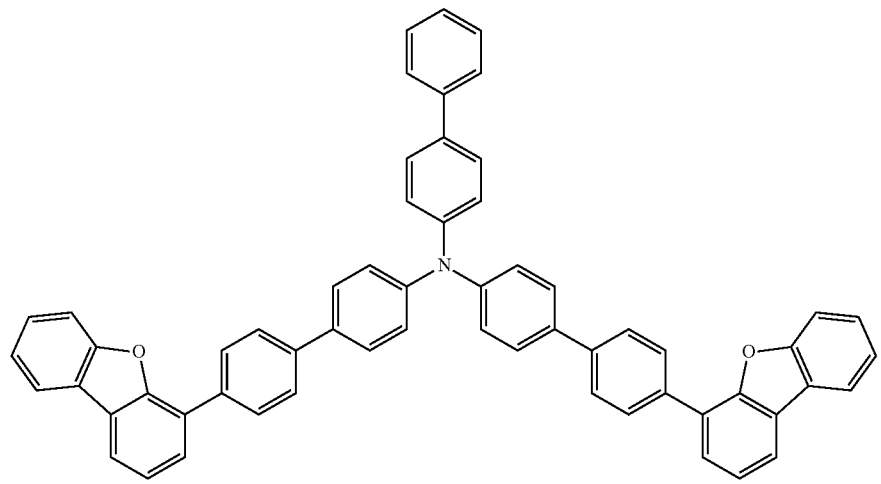

-continued
HT24
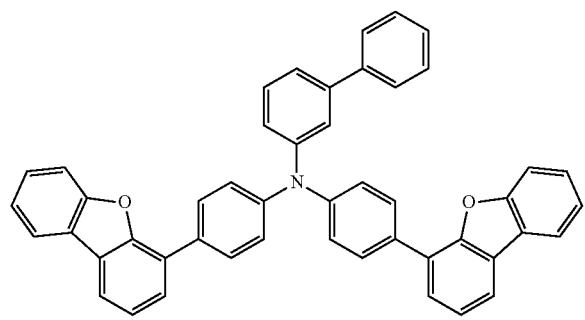
HT25
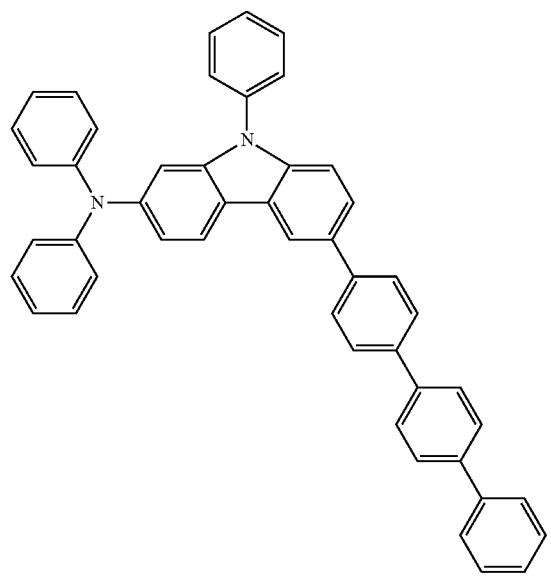
HT26
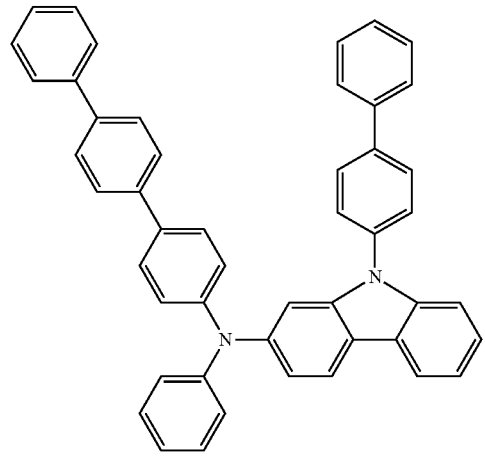
HT27
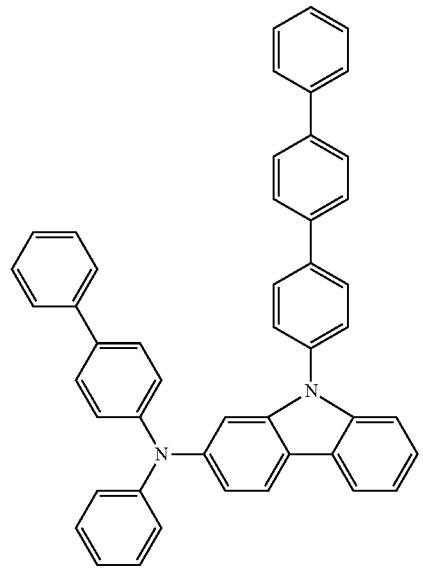
HT28
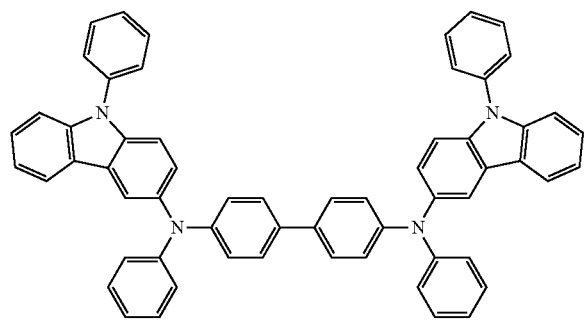
HT29
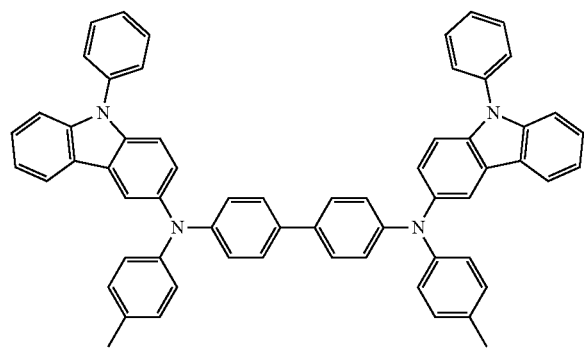

-continued
HT30
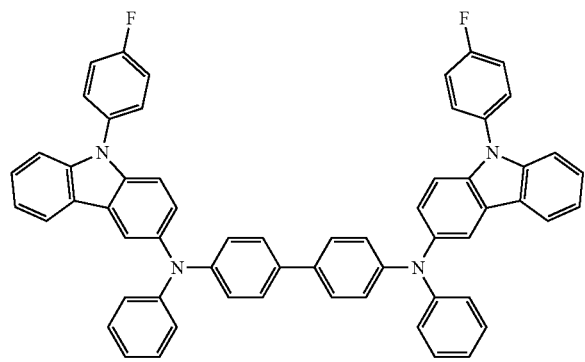
HT31
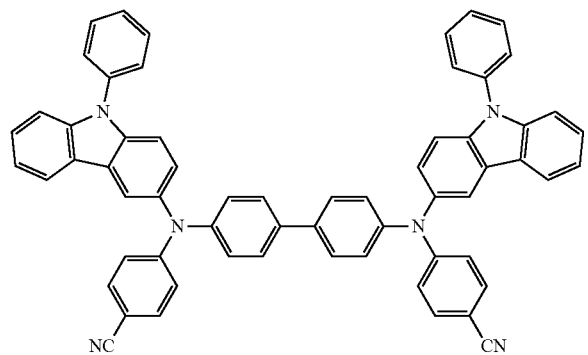
HT32
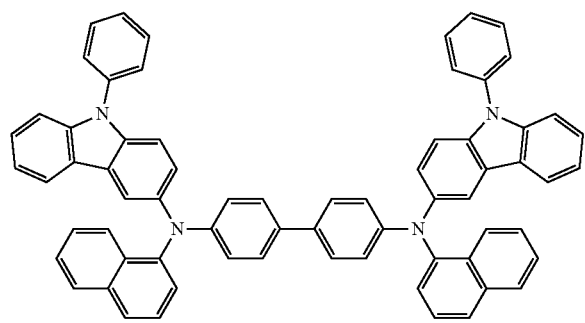
HT33
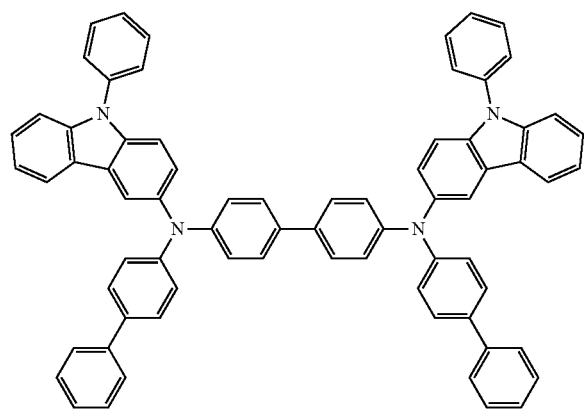
HT34
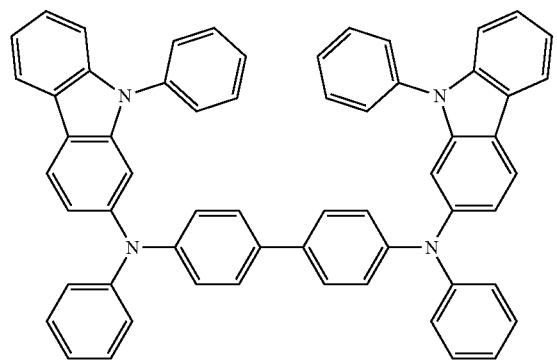
HT35
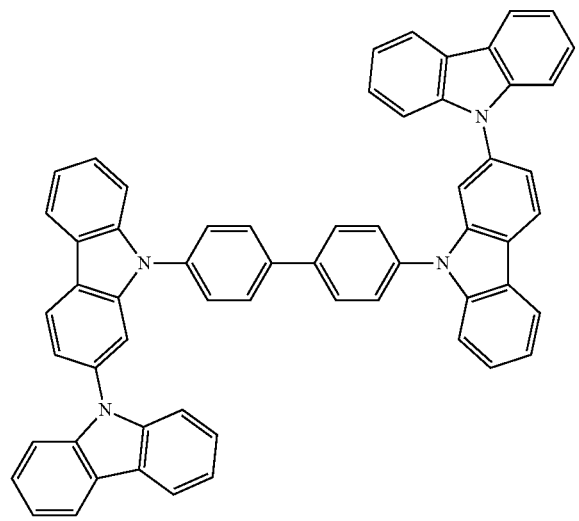

-continued
HT36
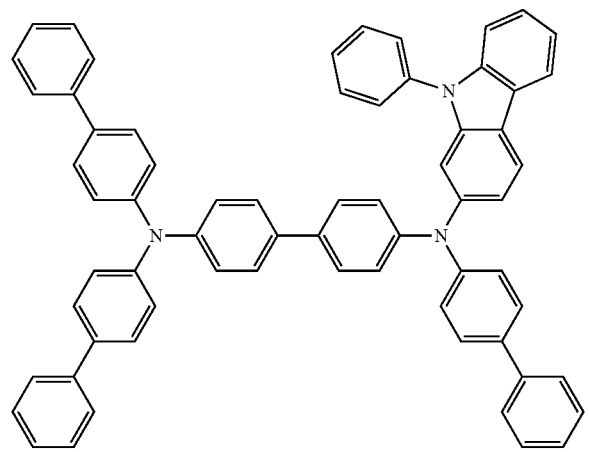
HT37
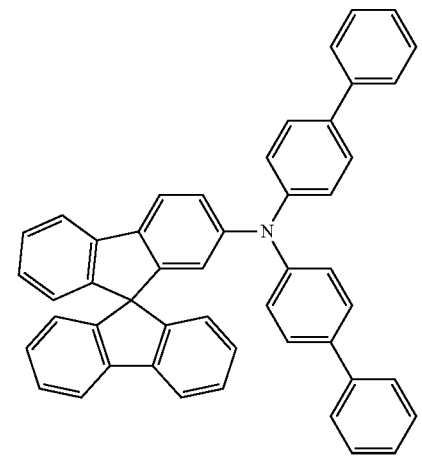
HT38
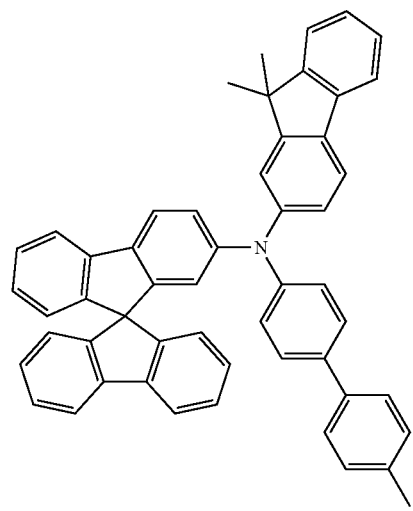
HT39
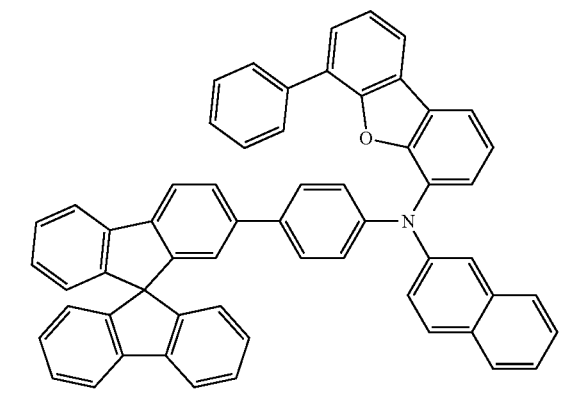
HT40
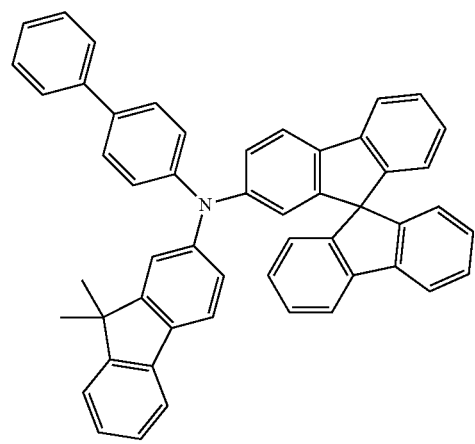
HT41
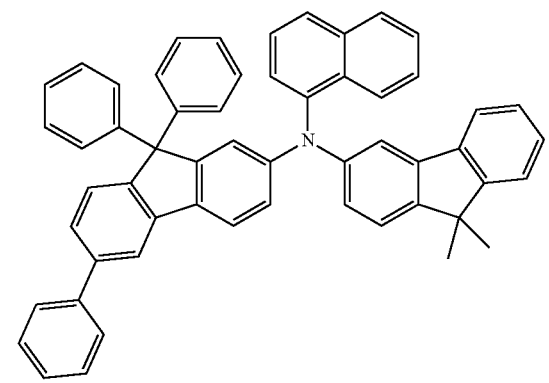

-continued
HT42
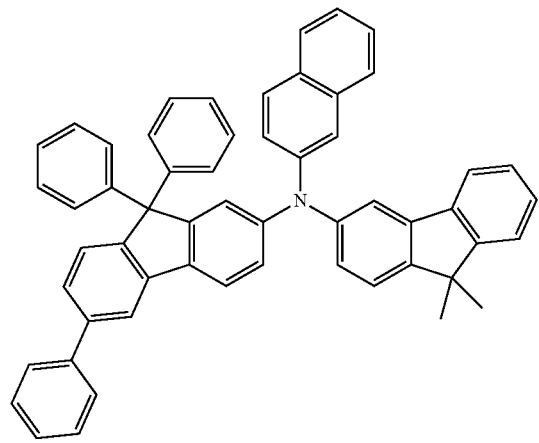
HT43
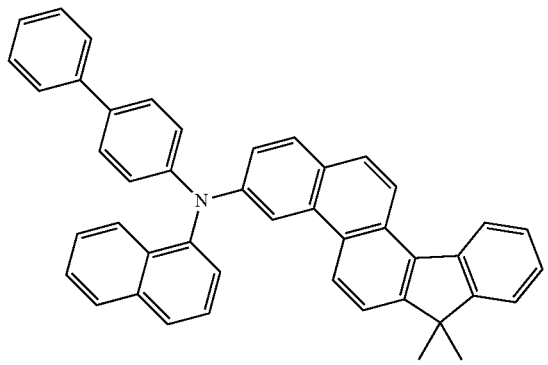
HT44
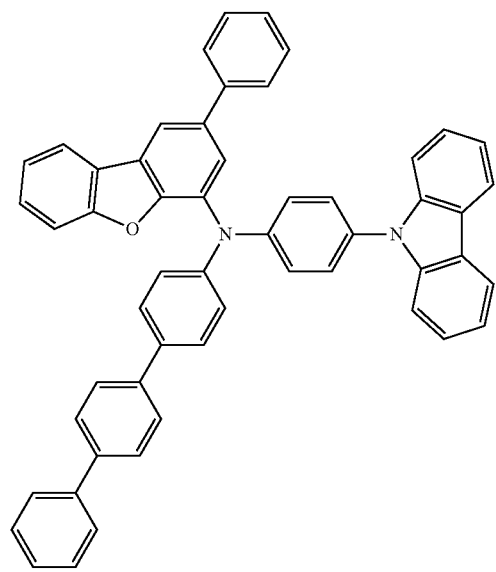
HT45
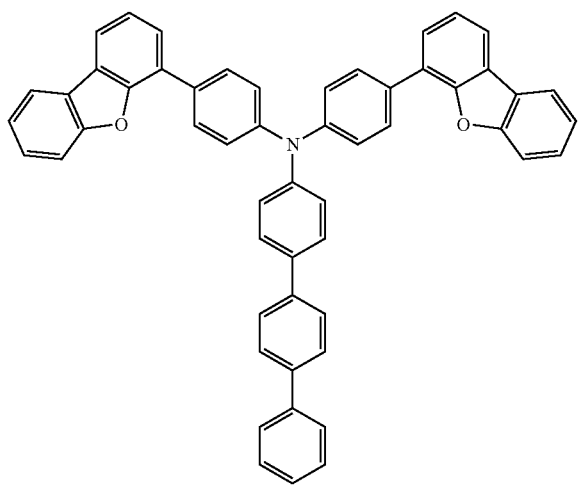
HT46
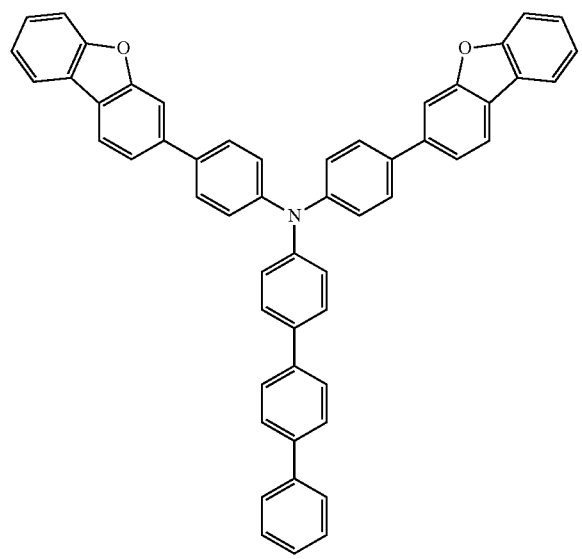
HT47
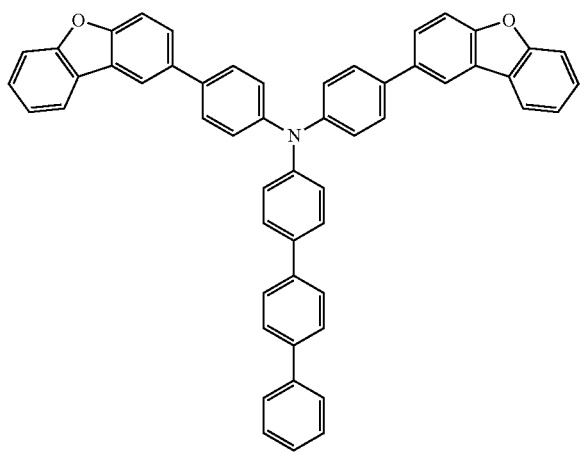

-continued
HT48

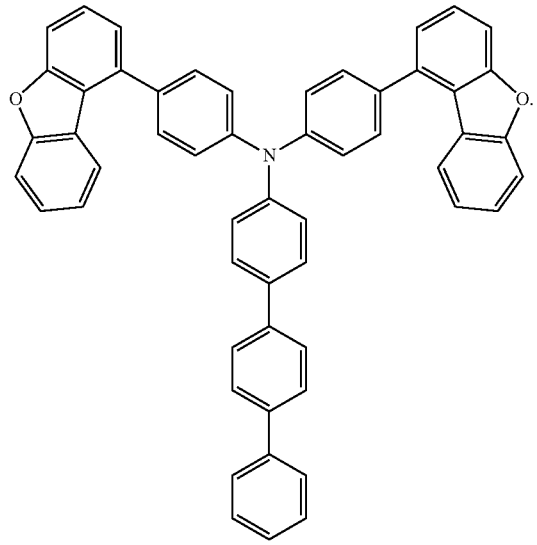

A thickness of the hole transport region may be about 100 Å to about 10,000 Å, for example, about 100 Å to about 1,000 Å. When the hole transport region includes at least one selected from a hole injection layer and a hole transport layer, the thickness of the hole injection layer may be about 100 Å to about 9,000 Å, for example, about 100 Å to about 1,000 Å, and the thickness of the hole transport layer may be about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance of the wavelength of light emitted by the emission layer 153, and the electron blocking layer may block or reduce the flow of electrons from the electron transport layer 155. The emission auxiliary layer and the electron blocking layer may each independently include the materials as described above.

P-Dopant

The hole transport region may further include, in addition to these materials, a charge-generation material for the improvement of conductive properties. The charge-generation material may be substantially homogeneously or non-homogeneously dispersed in the hole transport region.

The charge-generation material may be, for example, a p-dopant.

In one embodiment, a lowest unoccupied molecular orbital (LUMO) energy level of the p-dopant may be −3.5 eV or less.

In one embodiment, the p-dopant may include a quinone derivative, metal oxide, a cyano group-containing compound, or any combination thereof.

In one embodiment, the p-dopant may include at least one selected from:
a quinone derivative (such as tetracyanoquinodimethane (TCNQ) and/or 2,3,5,6-tetrafluoro-7,7,8,8-tetracyano-quinodimethane (F4-TCNQ));
a metal oxide (such as tungsten oxide and/or molybdenum oxide);
1,4,5,8,9,11-hexaazatriphenylene-hexacarbonitrile (HAT-CN); and
a compound represented by Formula 221:

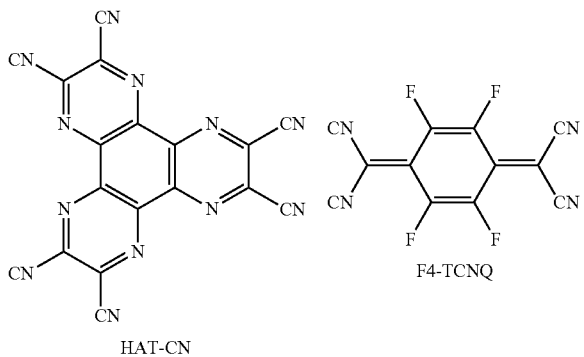

HAT-CN

F4-TCNQ

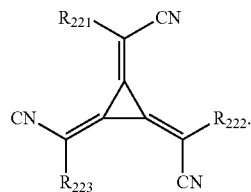

Formula 221

In Formula 221,
$R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer 153

The emission layer 153 may include any organic light-emitting material. The organic light-emitting material may include a host and/or a dopant. When the emission layer 153 includes a host and a dopant, an amount of the dopant may be about 0.01 parts by weight to about 15 parts by weight based on 100 parts by weight of the host. A thickness of the emission layer 153 including an organic light-emitting material may be about 100 Å to about 1,000 Å, for example, about 200 Å to about 600 Å. When the thickness of the emission layer 153 is within these ranges, excellent light-emission characteristics may be obtained without a substantial increase in driving voltage.

In one or more embodiments, the emission layer 153 may include a quantum dot. The thickness of the emission layer 153 including the quantum dot may be about 7 nm to about 100 nm, for example, about 15 nm to about 50 nm. Within these ranges, the light-emitting device may have excellent emission efficiency and/or lifespan properties due to the control of pores that may be generated by quantum dot particle arrangement.

When the light-emitting device is a full color light-emitting device, the emission layer 153 may include a plurality of emission layers to emit light of different colors for each sub-pixel.

Host of Emission Layer 153

In one or more embodiments, the host may include a compound represented by Formula 301:

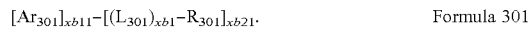

Formula 301

In Formula 301,

Ar$_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, R$_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be 1, 2, 3, 4, or 5, and Q$_{301}$ to Q$_{303}$ may each independently be the same as described in connection with Q$_1$.

In one or more embodiments, when xb11 in Formula 301 is 2 or more, two or more Ar$_{301}$(s) may be linked to each other via a single bond.

In one embodiment, the host may include a compound represented by Formula 301-1, a compound represented by Formula 301-2, or any combination thereof:

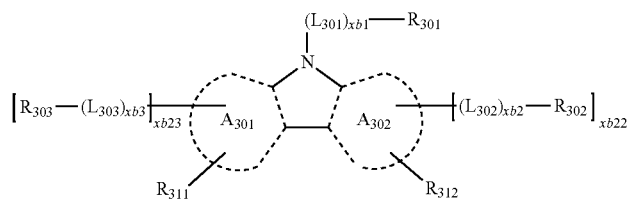

Formula 301-1

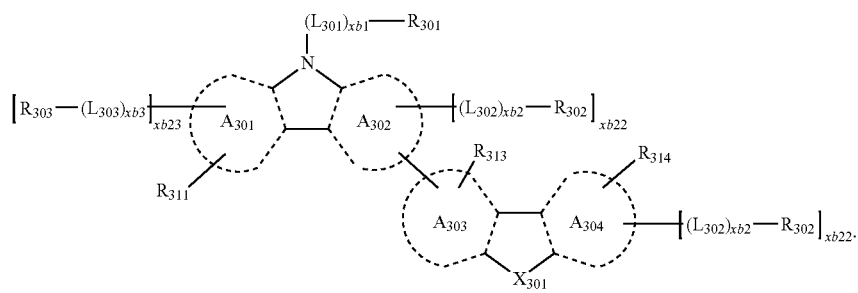

Formula 301-2

In Formulae 301-1 and 301-2, ring A$_{301}$ to ring A$_{304}$ may each independently be a $C_5$-$C_{60}$ carbocyclic group or a $C_1$-$C_{60}$ heterocyclic group, X$_{301}$ may be O, S, N-[(L$_{304}$)$_{xb4}$-R$_{304}$], C(R$_{304}$)(R$_{305}$), or Si(R$_{304}$)(R$_{305}$), xb22 and xb23 may each independently be 0, 1, or 2, $L_{301}$, xb1, and $R_{301}$ may each independently be the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one or more embodiments, the host may include an alkaline earth metal complex. For example, the host may be a Be complex (for example, Compound H55) or a Mg complex. In some embodiments, the host may be or include a Zn complex, or any combination of the above.

[Phosphorescent Dopant in Emission Layer 153]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may further include an organometallic compound represented by Formula 401:

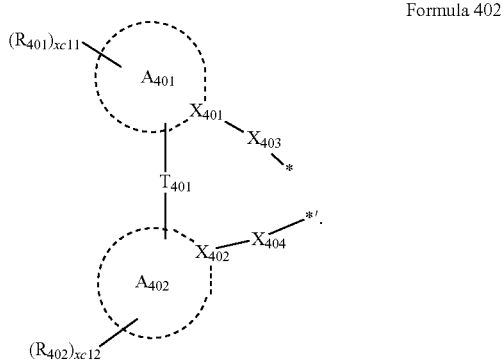

Formula 402

In Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)*', *—C($Q_{411}$)($Q_{412}$)*', *—C($Q_{411}$)=C($Q_{412}$)—', *—C($Q_{411}$)=*', or *=C($Q_{411}$)—*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may be nitrogen at the same time.

In one or more embodiments, when xc1 in Formula 402 is 2 or more, two ring $A_{401}$(s) in two or more $L_{401}$ (s) may optionally be linked to each other via $T_{402}$, which is a linking group, or two ring $A_{402}$(s) in two or more $L_{401}$ (s) may optionally be linked to each other via $T_{403}$, which is a linking group. $T_{402}$ and $T_{403}$ may each independently be the same as described in connection with $T_{401}$.

$L_{402}$ in Formula 401 may be an organic ligand. For example, $L_{402}$ may be a halogen group, a diketone group (for example, an acetylacetonate group), a carboxylic acid group (for example, picolinate group), —C(=O), an isonitrile group, a —CN group, a phosphorus group (for example, a phosphine group or a phosphite group), or any combination thereof.

[Fluorescent Dopant in Emission Layer 153]

The fluorescent dopant may include an amine group-containing compound, a styryl group-containing compound, or any combination thereof.

For example, the fluorescent dopant may include a compound represented by Formula 501:

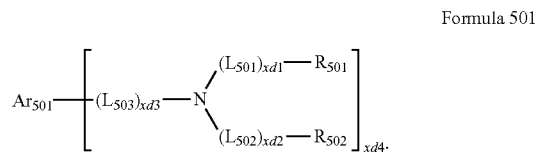

Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

For example, $Ar_{501}$ in Formula 501 may be a condensed cyclic ring (for example, an anthracene group, a chrysene group, a pyrene group, etc.) in which three or more monocyclic groups are condensed.

In one or more embodiments, xd4 in Formula 501 may be 2.

The fluorescent dopant may include an amine group-containing compound, a styryl group-containing compound, or any combination thereof.

Emission Layer 153 Including Quantum Dots

In one or more embodiments, the emission layer 153 may include a quantum dot (dots). The emission layer 153 may further include a matrix material in addition to the quantum dots. For example, the emission layer 153 may include a quantum dot (dots) and a matrix material, and the quantum dots may be dispersed in the matrix material.

For example, the quantum dot may include a Group II-VI semiconductor compound; a Group III-VI semiconductor compound; a Group III-V semiconductor compound; a Group IV-VI semiconductor compound; a Group IV element or compound; a Group I-III-VI semiconductor compound; or any combination thereof.

The Group II-VI semiconductor compound may include a binary compound (such as CdS, CdSe, CdTe, ZnS, ZnSe, ZnTe, ZnO, HgS, HgSe, HgTe, MgS, MgSe, and/or the like); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, and/or the like); a quaternary compound (such as CdZnSeS, CdZnSeTe, CdZnSTe, CdHgSeS, CdHgSeTe, CdHgSTe, HgZnSeS, HgZnSeTe, HgZnSTe, and)/or the like; or any combination thereof.

The Group III-VI semiconductor compound may include: a binary compound (such as $In_2S_3$ and/or $In_2Se$); a ternary compound (such as $InGaS_3$ and/or $InGaSe_3$); or any combination thereof.

The Group III-V semiconductor compound may include a binary compound (such as GaN, GaP, GaAs, GaSb, AlN, AlP, AlAs, AlSb, InN, InP, InAs, InSb, and/or the like); a ternary compound (such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and/or the like); a quaternary compound (such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like); or any combination thereof. The Group III-V semiconductor compound may further include Group II metal (for example, InZnP, etc.).

The Group IV-VI semiconductor compound may include a binary compound (such as SnS, SnSe, SnTe, PbS, PbSe, PbTe, and/or the like); a ternary compound (such as SnSeS, SnSeTe, SnSTe, PbSeS, PbSeTe, PbSTe, SnPbS, SnPbSe, SnPbTe, and/or the like); a quaternary compound (such as SnPbSSe, SnPbSeTe, SnPbSTe, and/or the like); or any combination thereof.

The Group IV element or a compound including the same may include Si and/or Ge; a binary compound (such as SiC, SiGe, and/or the like); or any combination thereof.

The Group I-III-VI semiconductor compound may include a ternary compound (such as AgInS, $AgInS_2$, CuInS, $CuInS_2$, $CuGaO_2$, $AgGaO_2$, $AgAlO_2$, or any combination thereof).

The quantum dot may have a substantially homogeneous structure in terms of components and composition; or a composite structure (such as a core-shell structure, a gradient structure, and/or the like). The shell of the core-shell structure may be a single shell having a homogeneous component and composition, or may be a multi-shell structure including two or more layers having different components and/or compositions.

For example, in the core-shell structure, a material constituting the core and a material constituting the shell may each independently be selected from the semiconductor compounds described above.

In one embodiment, the quantum dot may include a Group III-V semiconductor compound.

In one embodiment, the quantum dot may include In.

In one or more embodiments, the quantum dot may include In and P.

In one or more embodiments, the quantum dot may include a Group III-V semiconductor compound and a Group II-VI semiconductor compound.

In one or more embodiments, the quantum dot may have a core-shell structure, the core may be a Group III-V semiconductor compound, and the shell may be a Group II-VI semiconductor compound.

In one or more embodiments, the quantum dot may have a core-shell structure, the core may be GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the shell may be CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

In one or more embodiments, the quantum dot may have a core-shell structure, and the core may be CdSe, CdS, ZnS, ZnSe, CdTe, CdSeTe, CdZnS, PbSe, AgInZnS, ZnO, InN, InP, InAs, InSb, InGaP or any combination thereof, and the shell may be CdSe, ZnSe, ZnS, ZnSeS ZnTe, CdTe, PbS, TiO, SrSe, HgSe, or any combination thereof.

In one or more embodiments, the quantum dot may be a InP/ZnS or InP/ZnSeS core-shell quantum dot.

The quantum dot may be synthesized using any suitable method (such as a wet chemical process, a metal organic chemical vapor deposition process (MOCVD), and/or a molecular beam epitaxy (MBE) process).

An average particle diameter of the quantum dot may be about 1 nm to about 20 nm, for example, about 1 nm to about 15 nm, for example, about 1 nm to about 10 nm.

When the quantum dot has a core-shell structure, the ratio of the radius of the core to the thickness of the shell may be 2:8 to 8:2, for example, 3:7 to 7:3, for example, 4:6 to 6:4.

The matrix material may include a polymer acting as a medium through which the quantum dots are dispersed.

Electron Transport Layer 155

The electron transport layer 155 may be located between the emission layer 153 and the second electrode 190. The electron transport layer 155 may transfer (transport) electrons injected from the second electrode 190 to the emission layer 153.

The electron transport layer 155 may not include carbon. For example, the electron transport layer 155 may not include an organic material.

In one embodiment, the electron transport layer 155 may include an inorganic material.

In one embodiment, the electron transport layer 155 may consist of an inorganic material.

In one or more embodiments, the electron transport layer 155 includes an inorganic material, and the inorganic material may have the form of inorganic nanoparticles. For example, the average particle diameter of the inorganic nanoparticles may be about 3 nm to about 15 nm. When the average particle diameter of the inorganic nanoparticles satisfies the above-described range, the electron mobility and/or external light extraction efficiency of the electron transport layer 155 may be improved.

The inorganic material may be a material to provide excellent electron mobility.

For example, the inorganic material may include a first material, the first material may include an oxide of $A^1$, a nitride of $A^1$, a sulfide of $A^1$, an oxynitride of $A^1$, or any combination thereof, and $A^1$ may be or include zinc (Zn), magnesium (Mg), zirconium (Zr), tin (Sn), tungsten (W), tantalum (Ta), hafnium (Hf), aluminum (Al), titanium (Ti), barium (Ba), or any combination thereof.

In some embodiments, the inorganic material may further include a second material in addition to the first material, and the second material may include lithium (Li), sodium (Na), potassium (K), rubidium (Rb), cesium (Cs), beryllium (Be), magnesium (Mg), calcium (Ca), strontium (Sr), barium (Ba), copper (Cu), aluminum (Al), gallium (Ga), indium (In), silicon (Si), or any combination thereof.

In some embodiments, the second material may be the form of a metal ion and may be doped in the first material.

In one embodiment, the inorganic material may include:
ZnO nanoparticles (first material); or
ZnO nanoparticles (first material) that may further include Li, Na, K, Rb, Cs, Be, Mg, Ca, Sr, Ba, Cu, Al, Ga, In, Si, or any combination thereof (second material).

In one embodiment, the inorganic material may include zinc oxide (ZnO), zinc magnesium oxide (ZnMgO), zinc aluminum oxide (ZnAlO), titanium dioxide ($TiO_2$), magnesium oxide (MgO), zirconium oxide ($ZrO_2$), tin oxide (SnO), tin dioxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanum oxide ($BaTiO_3$), barium zirconium oxide ($BaZrO_3$), or any combination thereof.

A thickness of the electron transport layer 155 may be about 100 Å to about 1,000 Å, for example, about 150 Å to about 500 Å. When the thickness of the electron transport layer 155 is within the ranges described above, the electron transport layer may have satisfactory electron transport characteristics without a substantial increase in driving voltage.

The electron transport layer 155 may not include (e.g., may exclude) carbon, as described above. For example, the electron transport layer 155 does not include an organic material, and may only include an inorganic material. Thus, deterioration of the electron transport layer 155 due to heat generation during driving and excess excitons leakage from the emission layer 153 may be substantially prevented or reduced. Thus, the light-emitting device 10 may have excellent emission efficiency and/or lifespan properties.

Metal-Nucleation Inducing Layer 157

The metal-nucleation inducing layer 157 may be located between the electron transport layer 155 and the second electrode 190.

The metal-nucleation inducing layer 157 may include a metal-nucleation inducing material.

The metal-nucleation inducing material may include at least one metal-nucleation inducing group.

The metal-nucleation inducing layer 157 may be in direct contact with the electron transport layer 155. Thus, for example, when the electron transport layer 155 includes inorganic nanoparticles, the gap between the inorganic nanoparticles may be filled by the metal-nucleation inducing layer 157, so that the film uniformity and electron mobility of the electron transport layer 155 may be improved.

For example, the metal-nucleation inducing material may be or include a metal complex, a low molecular weight organic compound, a polymer, or any combination thereof, each including at least one of the metal-nucleation inducing groups described below.

The metal included in the metal complex is a metal that may contribute to the migration of electrons, and may not be a transition metal.

For example, the metal included in the metal complex may be Li, Na, K, Rb, Cs, Be, Mg, Ca, Sr, Ba, Cu, Al, Ga, or In.

In some embodiments, the molecular weight of the low molecular weight organic compound may be 30 or more. For example, the molecular weight of the low molecular weight organic compound may be about 30 to about 700.

The metal-nucleation inducing group may be: i) a π electron-deficient nitrogen-containing $C_1$-$C_{60}$ cyclic group unsubstituted or substituted with at least one $R_1$ or ii) a group represented by one of Formulae 1A to 1E (for example, a group represented by Formula 1B or 1C), and may not include a group represented by *—C(=O)(OH) and a cyano group:

| | |
|---|---|
| *O($Q_1$) | Formula 1A |
| *S($Q_1$) | Formula 1B |
| *—N($Q_1$)($Q_2$) | Formula 1C |
| *—P($Q_1$)($Q_2$) | Formula 1D |
| *—P(=O)($Q_1$)($Q_2$). | Formula 1E |

$R_1$, $Q_1$, and $Q_2$ may each independently be hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and

* indicates a binding site to a neighboring atom.

The π electron-deficient nitrogen-containing $C_1$-$C_{60}$ cyclic group may be: i) a first ring, ii) a condensed cyclic group in which two or more first rings are condensed with each other, or iii) a condensed cyclic group in which at least one first ring is condensed with at least one second ring, the first ring may be or include an oxazole group, an isoxazole group, an oxadiazole group, an isoxadiazole group, an oxatriazole group, an isoxatriazole group, a thiazole group, an isothiazole group, a thiadiazole group, isothiadiazole group, a thiatriazole group, an isothiatriazole group, a pyrazole group, an imidazole group, a triazole group, a tetrazole group, an azasilole group, a diazasilole group, a triazasilole group, a pyridine group, a pyrimidine group, a pyrazine group, a pyridazine group, or a triazine group, and the second ring may be or include a cyclopentane group, a cyclohexane group, cyclopentadiene group, a cyclohexene group, a benzene group, a furan group, a thiophene group, a pyrrole group, a silole group, an indene group, a benzofuran group, a benzothiophene group, an indole group, or a benzosilole group.

In one embodiment, a π electron-deficient nitrogen-containing $C_1$-$C_{60}$ cyclic group that is unsubstituted or substituted with at least one $R_1$ may include an azaindole group, an azaindene group, an azabenzosilole group, an azabenzothiophene group, an azabenzofuran group, an azacarbazole group, an azafluorene group, an azadibenzosilole group, an azadibenzothiophene group, an azadibenzoselenophene group, a pyridine group, a pyrimidine group, a pyrazine group, a pyridazine group, a triazine group, a quinoline group, an isoquinoline group, a quinoxaline group, a quinazoline group, a phenanthroline group, an acridine group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each being unsubstituted or substituted with at least one $R_1$.

In one embodiment, $R_1$, $Q_1$, and $Q_2$ may each independently be hydrogen, a substituted unsubstituted $C_1$-$C_{60}$ alkyl group, a substituted unsubstituted $C_6$-$C_{60}$ aryl group, a substituted unsubstituted $C_1$-$C_{60}$ heteroaryl group, a substituted unsubstituted monovalent non-aromatic condensed polycyclic group, or a substituted unsubstituted monovalent non-aromatic condensed heteropolycyclic group.

In one or more embodiments, $R_1$, $Q_1$, and $Q_2$ may each independently be:

hydrogen or a $C_1$-$C_{20}$ alkyl group; or a phenyl group, a naphthyl group, a carbazolyl group, a fluorenyl group, a dibenzofuranyl group, or a dibenzothiophenyl group, each being unsubstituted or substituted with at least one $C_1$-$C_{20}$ alkyl group, a phenyl group, or any combination thereof.

In one or more embodiments, the metal-nucleation inducing material may be a metal complex including a π electron-deficient nitrogen-containing $C_1$-$C_{60}$ cyclic group that is unsubstituted or substituted with at least one $R_1$ (for example, see Compound 1 to be described later).

In one or more embodiments, the metal-nucleation inducing material may be a compound represented by Formula 2 or 3:

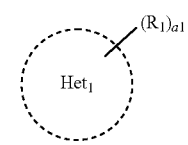

Formula 2

$(L_1)_{b1}$-$(T_1)_{c1}$ <Formula 3>

In Formula 2, ring $Het_1$ may be a π electron-deficient nitrogen-containing $C_1$-$C_{60}$ cyclic group as described herein, $R_1$ in Formula 2 may be the same as described above, a1 in Formula 2 may be an integer from 0 to 20, wherein, when a1 is 2 or more, two or more $R_1$(s) may be identical to or different from each other, $L_1$ in Formula 3 may be *—O—*', *—S—*', a $C_2$-$C_{60}$ alkylene group unsubstituted or substituted with at least one $R_{11}$, a $C_5$-$C_{60}$ carbocyclic group unsubstituted or substituted with at least one $R_{11}$, or a $C_1$-$C_{60}$ heterocyclic group unsubstituted or substituted with at least one $R_{11}$, and $R_{11}$ may be the same as described in connection with $R_1$, b1 in Formula 3 may be an integer from 1 to 20, wherein, when b1 is 2 or more, two or more Li(s) may be identical to or different from each other, $T_1$ in Formula 3 may be a group represented by one of Formulae 1A to 1E, c1 in Formula 3 may be an integer from 1 to 20, wherein, when c1 is 2 or more, two or more $T_1$(s) may be identical to or different from each other, and when $L_1$ in Formula 3 is *—O—*', *—S—*', an unsubstituted $C_2$-$C_{60}$ alkylene group, or a $C_2$-$C_{60}$ alkylene group substituted with at least one $R_{11}$, c1 is 2 or more.

In one embodiment, $L_1$ in Formula 3 may be *—O—*', *—S—*', a $C_2$-$C_{20}$ alkylene group unsubstituted or substituted with at least one $R_{11}$, or a benzene group unsubstituted or substituted with at least one $R_{11}$, or a naphthalene group unsubstituted or substituted with at least one $R_{11}$.

In one embodiment, b1 in Formula 3 may be an integer from 1 to 10, for example, an integer from 1 to 5.

In one or more embodiments, $T_1$ in Formula 3 may be a group represented by Formula 1B or 1C.

In one or more embodiments, c1 in Formula 3 may be an integer from 1 to 5, for example, an integer of 1 or 2.

For example, the metal-nucleation inducing material that may be included in the metal-nucleation inducing layer 157 may be one of Compounds 1 to 5 below:

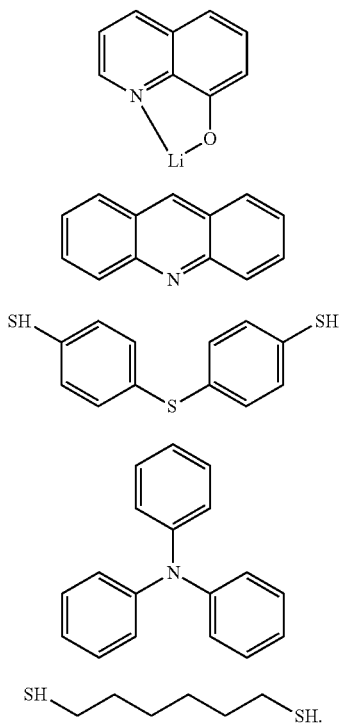

The thickness of metal-nucleation inducing layer 157 may be about 0.1 nm to about 20 nm or about 1 nm to about 10 nm. In one or more embodiments, the metal-nucleation inducing layer 157 may be a monolayer. When the thickness of the metal-nucleation inducing layer 157 satisfies the above-described ranges, metal-nucleation can be effectively induced when the second electrode 190 is formed, and satisfactory electron transport characteristics can be obtained without a substantial increase in driving voltage.

The metal-nucleation inducing layer 157 may be in direct contact with the second electrode 190.

Because:
1) the metal-nucleation inducing layer 157 may increase the film uniformity and/or electron transfer efficiency of the electron transport layer 155,
2) when the second electrode 190 is formed on the metal-nucleation inducing layer 157, metal nuclei may be generated relatively uniformly by the metal-nucleation inducing group and may provide excellent adhesion with the second electrode 190, and thus, the metal-nucleation inducing layer 157 may contribute to the formation of the second electrode 190 having excellent film uniformity, and
3) a dipole effect and/or work function adjustment effect induced by the metal-nucleation group may increase the efficiency of the light-emitting device 10 and/or improve the light transmittance of the second electrode 190, the emission efficiency and/or lifespan of the light-emitting device 10 may be improved using the metal-nucleation inducing layer 157.

Second Electrode 190

The second electrode 190 is located on the metal-nucleation inducing layer 157. The second electrode 190 may be a cathode (which is an electron injection electrode), and a metal, an alloy, an electrically conductive compound, or any combination thereof, each having a low work function, may be used as the material for the second electrode 190.

According to one embodiment, the second electrode 190 may include silver (Ag), aluminum (Al), magnesium (Mg), calcium (Ca), strontium (Sr), barium (Ba), indium (In), or any combination thereof.

In one embodiment, the second electrode 190 may include, in addition to, Ag, Al, Mg, Ca, Sr, Ba, In, or any combination thereof, an alkali metal, a rare earth metal, or any combination thereof.

The alkali metal may include Li, Na, K, Rb, Cs, or any combination thereof. The rare earth metal may include Sc, Y, Ce, Tb, Yb, Gd, or any combination thereof.

The second electrode 190 may include a metal-containing film that is hybridized with a metal-nucleation inducing material included in the metal-nucleation inducing layer 157. For example, the metal of the metal-containing film included in the second electrode 190 may have a chemical bond with the metal-nucleation inducing material of the metal-nucleation inducing layer 157.

The second electrode 190 may be a transparent electrode, a semi transparent electrode, or a reflective electrode.

For example, the second electrode 190 may be a transparent electrode having a visible light transmittance of 50% or more (for example, 60% or more, 65% or more, 70% or more, 75% or more, 80% or more, 85% or more, 90% or more, or 95% or more) (for example, for light having a maximum emission wavelength of about 400 nm to about 700 nm). As a result, the light-emitting device 10 using the second electrode 190 may be a top emission type light-emitting device having excellent emission efficiency and/or lifespan properties.

The second electrode 190 may have a single-layered structure or a multi-layered structure including two or more layers.

The thickness of the second electrode 190 may be, for example, about 10 nm to about 1000 nm, and about 100 nm to about 300 nm.

Capping Layer

A first capping layer may be located outside the first electrode 110, and/or a second capping layer may be located outside the second electrode 190. In one embodiment, the light-emitting device 10 may include: a first capping layer, the first electrode 110, the emission layer 153, the electron transport layer 155, the metal-nucleation inducing layer 157, and the second electrode 190, which are sequentially stacked in this stated order; the first electrode 110, the emission layer 153, the electron transport layer 155, the metal-nucleation inducing layer 157, the second electrode 190 and second capping layer, which are sequentially stacked in this stated order; or the first capping layer, the first electrode 110, the emission layer 153, the electron transport layer 155, the metal-nucleation inducing layer 157, the second electrode 190, and the second capping layer.

Light generated by the emission layer 155 of the organic light-emitting device 10 may be extracted to the outside through the first electrode 110, which is a semi transparent electrode or a transparent electrode, and the first capping layer, and light generated by the emission layer 155 of the organic light-emitting device 10 may be extracted outside through the second electrode 190, which is a semi-transparent electrode or a transparent electrode, and the second capping layer.

The first capping layer and the second capping layer may increase the external luminescence efficiency of the device according to the principle of constructive interference.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth-based complex, or a combination thereof. The carbocyclic compound, the heterocyclic compound, and the amine group-containing compound may be optionally substituted with a substituent containing O, N, S, Se, Si, F, Cl, Br, I, or any combination thereof. In one embodiment, at least one selected from the first capping layer and the second capping layer may each independently include an amine group-containing compound.

For example, at least one of the first capping layer and second capping layer may each independently include a compound represented by Formula 201, a compound represented by Formula 202, or any combination thereof.

Apparatus

The organic light-emitting device 10 may be included in any suitable apparatus. For example, the organic light-emitting device 10 may be included in a light-emitting apparatus, an authentication apparatus, or an electronic apparatus.

The light-emitting apparatus may further include a thin-film transistor in addition to the organic light-emitting device 10 as described above. The thin-film transistor may include a source electrode, a drain electrode, and an active layer, and any one of the source electrode and the drain electrode may be electrically connected to one of the first electrode 110 and the second electrode 190 of the organic light-emitting device 10.

The thin-film transistor may further include a gate electrode, a gate insulation layer, and/or the like.

The active layer may include crystalline silicon, amorphous silicon, an organic semiconductor, an oxide semiconductor, and/or the like.

The light-emitting apparatus may further include a sealing portion for sealing the organic light-emitting device 10. The sealing portion may be located between the color filter and the organic light-emitting device 10. The sealing portion allows light from the organic light-emitting device 10 to be extracted to the outside, while simultaneously preventing or reducing external air and/or moisture from penetrating into the organic light-emitting device 10. The sealing portion may be a sealing substrate including a transparent glass and/or a plastic substrate. The sealing part may be a thin film encapsulation layer including a plurality of organic layers and/or a plurality of inorganic layers. When the sealing portion is a thin film encapsulation layer, the light-emitting apparatus may be flexible.

The light-emitting apparatus may be used in any suitable display, light source, and/or the like.

The authentication apparatus may be, for example, a biometric authentication apparatus for authenticating an individual using biometric information of a biometric body (for example, a fingertip, a pupil, and/or the like).

The authentication apparatus may further include, in addition to the organic light-emitting device 10, a biometric information collector.

Preparation Method

The respective layers constituting the hole transport region, the emission layer, the electron transport layer, and the metal-nucleated induction layer may each be formed in a set or predetermined region using one or more suitable methods selected from vacuum deposition, spin coating, casting, Langmuir-Blodgett (LB) deposition, ink jet printing, laser-printing, and/or laser-induced thermal imaging.

When the layers constituting the hole transport region, the emission layer, the electron transport layer, and the metal-nucleated induction layer are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on the material to be included and the structure of a layer to be formed.

When the layers constituting the hole transport region, the emission layer, the electron transport layer, and the metal-nucleated induction layer are formed by spin coating, the spin coating may be performed at a coating speed of about 2,000 rpm to about 5,000 rpm and at a heat treatment temperature of about 80° C. to 200° C., depending on the material to be included and the structure of a layer to be formed.

General Definition of Substituents

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and non-limiting examples thereof include an ethynyl group, and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cycloctyl group, an adamantanyl group, a norbornanyl group, a bicyclo[1.1.1]pentyl group, a bicyclo[2.1.1]hexyl group, a bicyclo[2.2.1]heptyl group, and a bicyclo[2.2.2] octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group with 1 to 10 carbon atoms containing a heteroatom (for example, N, O, Si, P, S, or any combination thereof) as a ring-forming atom, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group with 1 to 10 carbon atoms containing a heteroatom (for example, N, O, Si, P, S, or any combination thereof) as a ring-forming atom, wherein the ring has at least one a double bond. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent heterocyclic aromatic system having a heteroatom (for example, N, O, Si, P, S, or any combination thereof) as a ring-forming atom and 1 to 60 carbon atoms, and the term "$C_1$-$C_{60}$ heteroarylene group" as used herein refers to a bivalent heterocyclic aromatic system having a heteroatom (for example, N, O, Si, P, S, or any combination thereof) as a ring-forming atom and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to —$OA_{102}$ (wherein $A_{102}$ is a $C_6$-$C_{60}$ aryl group), and the term "$C_6$-$C_{60}$ arylthio group" as used herein refers to —$SA_{103}$ (wherein $A_{103}$ is a $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group in which two or more rings are condensed to each other, and which includes a heteroatom (for example, N, O, Si, P, and S, or any combination thereof) as a ring-forming atom other than carbon, and has no aromaticity in its entire molecular structure. Non-limiting examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a compound (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

Non-limiting examples of the $C_5$-$C_{60}$ carbocyclic group include a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, and an indenoanthracene group.

The term "$C_1$-$C_{60}$ heterocyclic group" as used herein refers to a monocyclic or polycyclic group including a heteroatom (for example, N, O, Si, P, S, or any combination thereof) as a ring-forming atom in addition to carbon (the carbon number may be 1 to 60). The $C_1$-$C_{60}$ heterocyclic group may be an aromatic heterocyclic group or a non-aromatic heterocyclic group. The $C_1$-$C_{60}$ heterocyclic group may be a compound (such as pyridine), a monovalent group (such as a pyridinyl group), or a divalent group (such as a pyridinylene group). In one or more embodiments, depending on the number of substituents connected to the $C_1$-$C_{60}$ heterocyclic group, the $C_1$-$C_{60}$ heterocyclic group may be a trivalent group or a quadrivalent group.

Non-limiting examples of the $C_1$-$C_{60}$ heterocyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzo isoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

The substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium (-D), —F, —Cl, —Br, —I, a hydroxyl group, a cyano group, a sulfhydryl group or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$);

—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$); or any combination thereof.

$Q_1$ to $Q_3$, $Q_{11}$ to $Q_{13}$, $Q_{21}$ to $Q_{23}$, and $Q_{31}$ to $Q_{33}$ referred to herein may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, or a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group". In other words, a "biphenyl group" is a substituted phenyl group having a $C_6$-$C_{60}$ aryl group as a substituent.

The term "terphenyl group" as used herein refers to "a phenyl group substituted with a biphenyl group". In other words, a "terphenyl group" is a phenyl group having, as a substituent, a $C_6$-$C_{60}$ aryl group substituted with a $C_6$-$C_{60}$ aryl group.

* and *' used herein, unless defined otherwise, each refer to a binding site to a neighboring atom in a corresponding formula.

EXAMPLES

Example 1

As an anode, a glass substrate with an ITO electrode deposited thereon was cut to a size of 50 mm×50 mm×0.7 mm, sonicated with acetone, isopropyl alcohol, and pure water for 15 minutes each, and then cleaned by exposure to ultraviolet rays and ozone for 30 minutes. Then, the glass substrate was provided to a vacuum deposition apparatus.

PEDOT:PSS were spin-coated on the ITO electrode and dried to form a hole injection layer having a thickness of 40 nm, and then, TFB was spin-coated on the hole transport layer to form a hole transport layer having a thickness of 40 nm.

A composition including an InP/ZnS core-shell quantum dot (average particle size: 3 nm to 8 nm) as a quantum dot was spin-coated on the hole transport layer at a coating speed of 3,500 rpm for 30 seconds, dried at room temperature for 5 minutes, and then dried at a temperature of 150° C. for 30 minutes, thereby forming an emission layer having a thickness of 30 nm.

A ZnMgO nano particles containing-composition was spin coated on the emission layer and naturally dried to form a ZnMgO electron transport layer having a thickness of 40 nm; Compound 1 was vacuum-deposited on the electron transport layer to form a metal-nucleation inducing layer having a thickness of 3.5 nm; and then Ag was deposited on the metal-nucleation inducing layer to form a cathode having a thickness of 150 nm, thereby completing the manufacture of a light-emitting device.

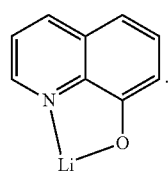

1

Comparative Example 1

A light-emitting device was manufactured in substantially the same manner as in Example 1, except that a metal-nucleation inducing layer was not formed and a cathode was directly formed on the electron transport layer.

Comparative Example 2

A light-emitting device was manufactured in substantially the same manner as in Example 1, except that, in forming the electron transport layer, 8-(4-(4,6-di(naphthalene-2-yl)-1,3,5-triazin-2-yl)phenyl)quinoline and Compound 1 were co-deposited at the weight ratio of 1:1, instead of ZnMgO nano particles.

Evaluation Example 1

The driving voltage (V), current density (mA/cm$^2$), and emission efficiency (cd/A) of the light-emitting devices of Example 1 and Comparative Examples 1 and 2 were measured using a Keithley SMU 236 and luminance meter PR650, and the results are shown as relative values (%) in Table 1.

TABLE 1

| | Electron transport layer | Metal-nucleation inducing layer | Driving voltage (Relative value, %) | Current density (Relative value, %) | Emission efficiency (Relative value, %) |
|---|---|---|---|---|---|
| Example 1 | ZnMgO nano-particles | Compound 1 | 72.5 | 70.9 | 142.1 |
| Comparative Example 1 | ZnMgO nanoparticles | — | 100 | 100 | 100 |
| Comparative Example 2 | 8-(4-4,6-di(naphthalene-2-yl)-1,3,5-triazine-2-yl)phenyl)quinoline: Compound 1 | Compound 1 | 142.5 | 95.4 | 105.3 |

From Table 1, it can be seen that the light-emitting device of Example 1 has improved driving voltage, improved current density and improved emission efficiency compared to the light-emitting devices of Comparative Examples 1 and 2.

The light-emitting device according to embodiments of the present disclosure may have excellent emission efficiency and/or lifespan properties, and thus, a high-quality apparatus can be implemented using the light-emitting device.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the FIGURES, it will be understood by those of ordinary skill in the art that various changes in form and details may be made therein without departing from the spirit and scope as defined by the following claims and equivalents thereof.

What is claimed is:

1. A light-emitting device comprising:
  a first electrode;
  a second electrode facing the first electrode;
  an emission layer between the first electrode and the second electrode;
  an electron transport layer between the emission layer and the second electrode; and
  a metal-nucleation inducing layer between the electron transport layer and the second electrode,
  the electron transport layer comprising an inorganic material comprising a first material comprising
    a nitride of $A^1$ and/or an oxynitride of $A^1$, and
    $A^1$ comprising zinc (Zn), magnesium (Mg), zirconium (Zr), tin (Sn), tungsten (W), tantalum (Ta), hafnium (Hf), aluminum (Al), titanium (Ti), barium (Ba), or any combination thereof,
  wherein the electron transport layer substantially does not comprise carbon or a metal oxide,
  the metal-nucleation inducing layer comprises a metal-nucleation inducing material,
  the metal-nucleation inducing material comprises at least one metal-nucleation inducing group,
  the metal-nucleation inducing group is a π electron-deficient nitrogen-containing $C_1$-$C_{60}$ cyclic group unsubstituted or substituted with at least one $R_1$ or a group represented by one of Formulae 1A to 1E, and does not comprise a group represented by *—C(=O)(OH) and a cyano group,
  the metal-nucleation inducing layer is in direct contact with the second electrode, and
  the second electrode comprises a metal-containing film that is hybridized with the metal-nucleation inducing material:

*O($Q_1$)  <Formula 1A>

*S($Q_1$)  <Formula 1B>

*—N($Q_1$)($Q_2$)  <Formula 1C>

*—P($Q_1$)($Q_2$)  <Formula 1D>

*—P(=O)($Q_1$)($Q_2$),  <Formula 1E> and wherein $R_1$, $Q_1$, and $Q_2$ are each independently hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and
  * indicates a binding site to a neighboring atom.

2. The light-emitting device of claim 1, wherein the emission layer comprises a quantum dot.

3. The light-emitting device of claim 2, wherein the quantum dot comprises a Group III-V semiconductor compound and/or a Group II-VI semiconductor compound.

4. The light-emitting device of claim 1, wherein
  the inorganic material consists of a first material and a second material,
  the first material is at least one selected from the group consisting of a nitride of $A^1$, an oxynitride of $A^1$, and combinations thereof,
  $A^1$ comprises zinc (Zn), magnesium (Mg), zirconium (Zr), tin (Sn), tungsten (W), tantalum (Ta), hafnium (Hf), aluminum (Al), titanium (Ti), barium (Ba), or any combination thereof, and
  the second material comprises lithium (Li), sodium (Na), potassium (K), rubidium (Rb), cesium (Cs), beryllium (Be), magnesium (Mg), calcium (Ca), strontium (Sr), barium (Ba), copper (Cu), aluminum (Al), gallium (Ga), indium (In), silicon (Si), or any combination thereof.

5. The light-emitting device of claim 1, wherein the metal-nucleation inducing layer is in direct contact with the electron transport layer.

6. The light-emitting device of claim 1, wherein the metal-nucleation inducing material comprises a metal complex, a low molecular weight organic compound, and/or a polymer.

7. The light-emitting device of claim 6, wherein the metal of the metal complex comprises Li, Na, K, Rb, Cs, Be, Mg, Ca, Sr, Ba, Cu, Al, Ga, or In.

8. The light-emitting device of claim 1, wherein:
  the π electron-deficient nitrogen-containing $C_1$-$C_{60}$ cyclic group is: i) a first ring, ii) a condensed cyclic group in which two or more first rings are condensed with each other, or iii) a condensed cyclic group in which at least one first ring is condensed with at least one second ring,
  the first ring comprises an oxazole group, an isoxazole group, an oxadiazole group, an isoxadiazole group, an oxatriazole group, an isoxatriazole group, a thiazole group, an isothiazole group, a thiadiazole group, isothiadiazole group, a thiatriazole group, an isothiatriazole group, a pyrazole group, an imidazole group, a triazole group, a tetrazole group, an azasilole group, a diazasilole group, a triazasilole group, a pyridine group, a pyrimidine group, a pyrazine group, a pyridazine group, or a triazine group, and
  the second ring comprises a cyclopentane group, a cyclohexane group, a cyclopentadiene group, a cyclohexene group, a benzene group, a furan group, a thiophene group, a pyrrole group, a silole group, an indene group, a benzofuran group, a benzothiophene group, an indole group, or a benzosilole group.

9. The light-emitting device of claim 1, wherein the IT electron-deficient nitrogen-containing $C_1$-$C_{60}$ cyclic group that is unsubstituted or substituted with at least one $R_1$ comprises an azaindole group, an azaindene group, an azabenzosilole group, an azabenzothiophene group, an azabenzofuran group, an azacarbazole group, an azafluorene group, an azadibenzosilole group, an azadibenzothiophene group, an azadibenzoselenophene group, a pyridine group, a pyrimidine group, a pyrazine group, a pyridazine group, a triazine group, a quinoline group, an isoquinoline group, a quinoxaline group, a quinazoline group, a phenanthroline group, an acridine group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_1$.

10. The light-emitting device of claim 1, wherein the metal-nucleation inducing material is a metal complex including a π electron-deficient nitrogen-containing $C_1$-$C_{60}$ cyclic group unsubstituted or substituted with at least one $R_1$.

11. The light-emitting device of claim 1, wherein the metal-nucleation inducing material is a compound represented by Formula 2 or 3:

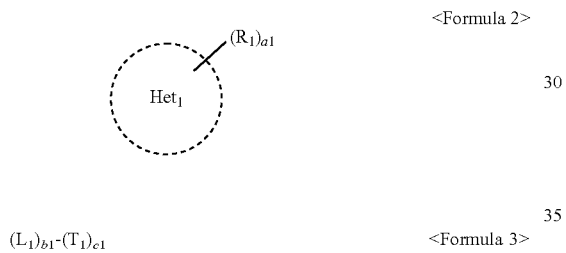

<Formula 2>

$(L_1)_{b1}$-$(T_1)_{c1}$ <Formula 3> wherein in Formula 2, ring $Het_1$ is a π electron-deficient nitrogen-containing $C_1$-$C_{60}$ cyclic group, $R_1$ is the same as described in claim 1, a1 is an integer from 0 to 20, wherein, when a1 is 2 or more, two or more $R_1$(s) are identical to or different from each other, $L_1$ in Formula 3 is *—O—*', *—S—*', a $C_2$-$C_{60}$ alkylene group unsubstituted or substituted with at least one $R_{11}$, a $C_5$-$C_{60}$ carbocyclic group unsubstituted or substituted with at least one $R_{11}$, or a $C_1$-$C_{60}$ heterocyclic group unsubstituted or substituted with at least one $R_{11}$, and $R_{11}$ is the same as described in connection with $R_1$ in claim 1, b1 in Formula 3 is an integer from 1 to 20, wherein, when b1 is 2 or more, two or more $L_1$(s) are identical to or different from each other, $T_1$ in Formula 3 is a group represented by one of Formulae 1A to 1E, c1 in Formula 3 is an integer from 1 to 20, wherein, when c1 is 2 or more, two or more $T_1$(s) are identical to or different from each other, and when $L_1$ in Formula 3 is *—O—*', *—S—', an unsubstituted $C_2$-$C_{60}$ alkylene group, or a $C_2$-$C_{60}$ alkylene group substituted with at least one $R_{11}$, c1 is 2 or more.

12. The light-emitting device of claim 1, wherein the metal-nucleation inducing material is one of Compounds 1 to 5:

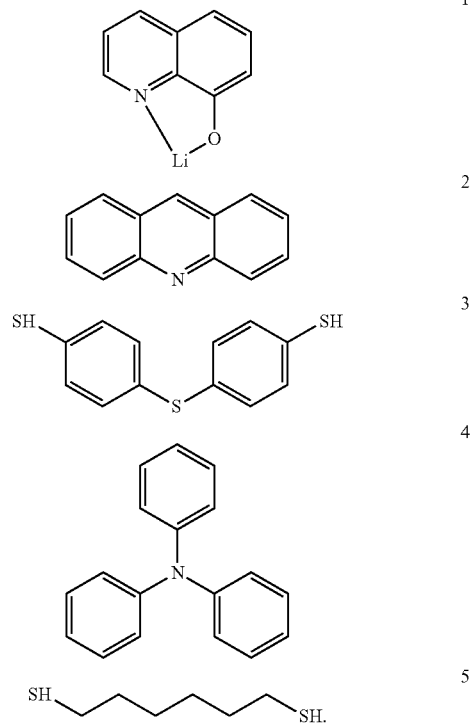

13. The light-emitting device of claim 1, wherein the thickness of the metal-nucleation inducing layer is about 0.1 nm to about 20 nm.

14. The light-emitting device of claim 1, wherein the second electrode comprises silver (Ag), aluminum (Al), magnesium (Mg), calcium (Ca), strontium (Sr), barium (Ba), indium (In), or any combination thereof.

15. The light-emitting device of claim 1, wherein the metal included in the metal-containing film of the second electrode is chemically bonded to the metal-nucleation inducing material.

16. A light-emitting device comprising:
a first electrode;
a second electrode facing the first electrode;
an emission layer between the first electrode and the second electrode,
an electron transport layer between the emission layer and the second electrode, and
a metal-nucleation inducing layer between the electron transport layer and the second electrode,
wherein,
the electron transport layer comprises an inorganic material comprising a first material comprising
a nitride of $A^1$ and/or an oxynitride of $A^1$, and
$A^1$ comprising magnesium (Mg), zirconium (Zr), tin (Sn), tungsten (W), tantalum (Ta), hafnium (Hf), aluminum (Al), titanium (Ti), barium (Ba), or any combination thereof,
the electron transport layer substantially does not comprise carbon or a metal oxide,
the metal-nucleation inducing layer comprises a metal-nucleation inducing material,
the metal-nucleation inducing material comprises at least one metal-nucleation inducing group,
the metal-nucleation inducing group is a π electron-deficient nitrogen-containing $C_1$-$C_{60}$ cyclic group unsubstituted or substituted with at least one $R_1$ or a group represented by one of Formulae 1A to 1E, and does not comprise a group represented by *—C(=O)(OH) and a cyano group, the metal-nucleation inducing layer is in direct contact with the second electrode, the second electrode comprises a metal-containing film that is hybridized with the metal-nucleation inducing material:

$$*O(Q_1) \quad \text{<Formula 1A>}$$

$$*S(Q_1) \quad \text{<Formula 1B>}$$

$$*-N(Q_1)(Q_2) \quad \text{<Formula 1C>}$$

$$*-P(Q_1)(Q_2) \quad \text{<Formula 1D>}$$

$$*-P(=O)(Q_1)(Q_2), \quad \text{<Formula 1E>}$$

$R_1$, $Q_1$, and $Q_2$ are each independently hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group,

* indicates a binding site to a neighboring atom, and wherein the second electrode is a transparent electrode having a visible light transmittance of 50% or more.

17. An apparatus comprising the light-emitting device of claim 1.

* * * * *